United States Patent [19]
Ito et al.

[11] Patent Number: 6,160,778
[45] Date of Patent: Dec. 12, 2000

[54] INFORMATION RECORDING MEDIUM, INFORMATION RECORDING METHOD, INFORMATION RECORDING APPARATUS AND INFORMATION REPRODUCING APPARATUS

[75] Inventors: Motoshi Ito, Osaka; Hiroshi Ueda, Hirakata; Yoshiho Gotoh; Yoshihisa Fukushima, both of Osaka, all of Japan

[73] Assignee: Matsushita Electric Industrial Co., Ltd., Osaka, Japan

[21] Appl. No.: 09/390,927

[22] Filed: Sep. 7, 1999

[30] Foreign Application Priority Data

Mar. 8, 1999 [JP] Japan ................... 11-059781

[51] Int. Cl.$^7$ ........................................... G11B 7/00
[52] U.S. Cl. .......................... 369/54; 369/275.3
[58] Field of Search ................. 369/56, 54, 58, 369/47, 32, 275.3

[56] References Cited

U.S. PATENT DOCUMENTS

| | | |
|---|---|---|
| 5,235,585 | 8/1993 | Bish et al. . |
| 5,818,654 | 10/1998 | Reddy et al. . |
| 6,031,804 | 3/1997 | Yamamuro ................... 369/54 |

FOREIGN PATENT DOCUMENTS

| | | |
|---|---|---|
| 0866456 | 9/1998 | European Pat. Off. . |
| 11086454 | 3/1999 | Japan . |
| 11306545 | 11/1999 | Japan . |
| 0040310 | 2/2000 | Japan . |
| 9627882 | 9/1996 | WIPO . |
| 9630902 | 10/1996 | WIPO . |

OTHER PUBLICATIONS

Japanese Office Actions dated Feb. 17, 2000 for Japanese Patent Nos. 11–352463 and 11–269616 (with English Translations).

International Search Report regarding application No. PCT/JP99/04889.

*Primary Examiner*—Nabil Hindi
*Attorney, Agent, or Firm*—Renner, Otto, Boisselle & Sklar LLP

[57] ABSTRACT

An information recording medium of the present invention includes: a volume space in which user data is recorded; a spare area including a replacement area which may be used in place of a defective area included in the volume space; and a defect management information area in which defeat management information for managing the defective area is recorded. The defect management information includes status information indicating whether the defective area is replaced by the replacement area.

3 Claims, 25 Drawing Sheets

FIG.23A

| | 7 | 6 | 5 | 4 | 3 | 2 | 1 | 0 |
|---|---|---|---|---|---|---|---|---|
| 0 | SKIP WRITE identification code ||||||||
| 1 | Reserved ||||||||
| 2 | Logical sector number ||||||||
| 3 | ||||||||
| 4 | ||||||||
| 5 | ||||||||
| 6 | Data length ||||||||
| 7 | ||||||||
| 8 | Area length ||||||||
| 9 | ||||||||
| 10 | Reserved ||||||||
| 11 | ||||||||

FIG.23B

| | 7 | 6 | 5 | 4 | 3 | 2 | 1 | 0 |
|---|---|---|---|---|---|---|---|---|
| 0 | SKIP WRITE identification code ||||||||
| 1 | Reserved ||||||| Operation option |
| 2 | Logical sector number or reserved ||||||||
| 3 | ||||||||
| 4 | ||||||||
| 5 | ||||||||
| 6 | Reserved ||||||||
| 7 | Area length or data length ||||||||
| 8 | ||||||||
| 9 | Reserved ||||||||

FIG.24A

|   | 7 | 6 | 5 | 4 | 3 | 2 | 1 | 0 |
|---|---|---|---|---|---|---|---|---|
| 0 | REPORT SKIPPED ADDRESS identification code ||||||||
| 1 | Reserved ||||||||
| 2 | ||||||||
| 3 | ||||||||
| 4 | ||||||||
| 5 | ||||||||
| 6 | Reserved ||||||||
| 7 | Upper limit value for data size ||||||||
| 8 | ||||||||
| 9 | Reserved ||||||||

FIG.24B

|   | 7 | 6 | 5 | 4 | 3 | 2 | 1 | 0 |
|---|---|---|---|---|---|---|---|---|
| 0 | Number of location information points (=N) ||||||||
| 1 | ||||||||
| 2 | Reserved ||||||||
| 3 | ||||||||
| 4 | Location information of skipped defective area #1 ||||||||
| 5 | ||||||||
| 6 | ||||||||
| 7 | ||||||||
| 8 | Location information of skipped defective area #2 ||||||||
| 9 | ||||||||
| 10 | ||||||||
| 11 | ||||||||
| ⋮ | ⋮ ||||||||
|   | Location information of skipped defective area #N ||||||||

INFORMATION RECORDING MEDIUM, INFORMATION RECORDING METHOD, INFORMATION RECORDING APPARATUS AND INFORMATION REPRODUCING APPARATUS

BACKGROUND OF THE INVENTION

1. Field of the Invention

The present invention relates to an information recording medium, an information recording method, an information recording apparatus and an information reproducing apparatus.

2. Description of the Related Art

An optical disk is a type of information recording medium which has a sector structure. In recent years, as the recording density and the capacity of an optical disk have been increased, it has become more important to ensure the reliability thereof. In order to ensure the reliability, an optical disk apparatus performs defect management in which a sector on the disk which cannot be used for recording reproduction (hereinafter, referred to as a "defective sector") is replaced by another sector having a good condition. One standard for such defect management is ISO/IEC 10090 for 90 mm optical disks (hereinafter, referred to as the "ISO standard"), which is published from International Standards Organization (ISO).

As the first prior art example, an ECC block which is used by a DVD standard and the defect management method according to the ISO standard will be briefly described below.

FIG. 17 illustrates a physical structure of a disk 1. The disk 1 has a plurality of tracks 2 provided in the form of concentric circles or a spiral. Each of the tracks 2 is divided into a plurality of sectors 3. The disk 1 includes one or more disk information areas 4 and a data recording area 5.

The disk information area 4 stores various parameters needed to access the disk 1. In the example illustrated in FIG. 17, two disk information areas 4 are provided respectively along the inner and outer peripheries of the disk 1. The disk information area 4 along the inner periphery is also called a "lead-in" area, while the disk information area 4 along the outer periphery is also called a "lead-out" area.

Data is recorded/reproduced on/from the data recording area 5. Each sector 3 in the data recording area 5 is assigned an absolute address which is called a "physical sector number".

FIG. 18A illustrates a structure of an ECC (error correcting code) block which is a unit of error correcting code calculation. An ECC block contains main data (172 bytes× 48 rows), an inner code parity PI obtained by calculating error correcting codes for each row (in the horizontal direction), and an outer code parity PO obtained by calculating error correcting codes for each column (in the vertical direction).

An error correction method using such inner and outer parities is generally called a "product code-based error correction method". The product code-based error correction method is an error correction method which is effective for both random errors and burst errors (a group of localized errors). For example, consider a case where some random errors occurred, as well as two rows of burst errors due to a scratch made on the disk 1. Most of such burst errors are correctable using the outer codes, because they are 2-byte errors in the vertical direction. A column with many random errors may not completely be corrected by outer codes. Some errors may remain after an error correction operation using outer codes. However, such remaining errors are in most cases correctable using inner codes. Even if some errors still remain after the error correction operation using inner codes, such errors can further be reduced by performing an error correction operation using outer codes again. By employing such product codes, DVDs realize a sufficient error correction capability while saving the parity redundancy. In other words, the capacity for user data is increased by such saving of the parity redundancy.

In a larger capacity DVD, each ECC block includes 16 sectors so as to realize both an increased error correction capability and a reduced redundancy. The ECC block illustrated in FIG. 18A includes only 4 sectors for the sake of simplicity.

FIG. 18B illustrates an arrangement of sectors included in an ECC block. The outer code parities PO of the ECC block are divided into rows and proportionally distributed among the sectors. As a result, each recording sector includes data of 182 bytes×13 rows.

An upper level control unit (this generally corresponds to a host computer) instructs an optical disk apparatus to record or reproduce data by sectors. When instructed to reproduce data from a sector, the optical disk apparatus reproduces an ECC block including the sector from the disk, performs error correction on the reproduced data, and returns only a portion of the data which corresponds to the designated sector. When instructed to record data on a sector, the optical disk apparatus reproduces an ECC block including the sector from the disk, performs error correction on the reproduced data, and replaces a portion of the data which corresponds to the designated sector with recording data which has been received from the upper level control unit. Then, the optical disk apparatus recalculates error correcting codes for the ECC block and adds them to the ECC block, before the ECC block including the designated sector is recorded on the disk. Particularly, such a recording operation is called a "read modified write" operation.

In the following description, a "block" means an ECC block as described above.

FIG. 19 illustrates an exemplary physical space of the disk 1 for use with the defeat management method according to the ISO standard. The data recording area 5 includes a volume space 6 and a spare area 9.

The volume space 6 is managed by consecutive addresses, called "logical sector numbers". The volume space 6 includes a logical volume space 6a and logical volume structures 6b for storing information on the structure of the logical volume space 6a.

The spare area 9 includes at least one sector (for example, #1 spare block) which may be used in place of a defective sector if such a defective sector occurs in the volume space 6.

In the example illustrated in FIG. 19, a file A (indicated as "File-A" in FIG. 19) exists directly under a root directory (indicated as "ROOT" in FIG. 19). Among data blocks a to c included in the data extent of the root directory, the data block c is defective. The defective block c is replaced by #1 spare block in the spare area 9. Among data blocks d to g included in the data extent of the file A, the data block f is defective. The defective block f is replaced by #2 spare block in the spare area 9.

The replacement of each defective block by a spare block in the spare area 9 is registered in a secondary defect list ("SDL"). The SDL is stored in a defect management information area as a part of defect management information.

More recently, there is an attempt in the art to use a rewritable optical disk in a less expensive form of a bare disk with no cartridge, an a read-only optical disk. In view of the defect management, however, a bare disk is more likely to get fingerprints thereon, and the number of defective sectors may increase unexpectedly. Therefore, it is proposed in the art to use a dynamically expandable spare area rather than a fixed spare area.

Moreover, the increased capacity of an optical disk, along with the motion picture compression technique having been put into practical use, has paved the way to recording/reproduction of motion pictures on/from an optical disk. However, the conventional defect management method may not be suitable for such a motion picture application, in which real time processing is required. In particular, if a defective sector is replaced by a spare sector which is physically distant from the defective sector, it may take too much time to move the optical head to such a distant spare sector for ensuring the real time processing. Therefore, it has been proposed in the art to employ a new defect management method instead of the conventional method where a defective sector is replaced by a physically distant spare sector.

As the second prior art example, a proposed method for recording/reproducing AV data (i.e., audio video data) will be described below.

Each of FIGS. 20A and 20B illustrates an arrangement of AV data on a disk, which is suitable for AV data recording/reproduction. In FIGS. 20A and 20B, a suffix "h" denotes a hexadecimal number.

FIG. 20A illustrates an AV data arrangement where there is no defective sector. If there is no defective sector, the AV data including #1 data to #4 data can be recorded in sectors having consecutive logical sector numbers (LSN). Similarly, the AV data can be reproduced by reproducing the sectors having the consecutive logical sector numbers.

FIG. 20B illustrates an AV data arrangement where 16 sectors having logical sector numbers of n to n+0Fh are detected as defective sectors while recording data therein. In this case, the ECC block including the detected defective sector is skipped. As a result, #3 data is recorded in sectors having logical sector numbers of n+10h to n+1Fh, and #4 data is recorded in the following sectors having logical sector numbers of n+20h to n+2Fh. Such an operation of skipping sectors by ECC blocks is referred to as a "block skip".

FIG. 21 illustrates an exemplary physical space of the disk 1 which is suitable for AV data recording/reproduction.

In the example illustrated in FIG. 21, a file A (indicated as "File-A" in FIG. 21) containing AV data exists directly under a root directory (indicated as "ROOT" in FIG. 21). Among data blocks a to c included in the data extent of the root directory, the data block c is defective. The defective block c is replaced by #1 spare block in the spare area 9. It is assumed that a defective block f is detected while recording the AV data extent of the file A in an area provided for the AV data extent. In such a case, the defective block f is skipped. As a result, the AV data extent of the file A is recorded while being divided into an AV data extent I (including the data blocks d and e) and another AV data extent II (including the data blocks g and h).

The replacement of the defective block c by #1 spare block in the spare area 9 is registered in the SDL. However, the defective block f is not registered in the SDL because the defective block f was only skipped, and the defective block f is not replaced by a spare block (no spare block has even been allocated thereto).

However, there is a problem associated with the presence of such a defective block which is not registered in the SDL. The problem will be described below with reference to FIGS. 22A to 22C.

FIG. 22A illustrates a normally recorded ECC block. The ECC block is recorded over a plurality of sectors. Each sector begins with an ID containing the physical sector number of the sector, etc. Data is recorded in the area following the ID. The data is obtained by adding error correcting codes to main data and further interleaving the main data having the error correcting codes added thereto (see FIG. 18).

FIG. 22B illustrates an ECC block for which an overwrite operation failed. When the ECC block illustrated in FIG. 22A is overwritten with new data, new error correcting codes are calculated according to the new main data, and added to the ECC block. In the example illustrated in FIG. 22B, however, the third sector has a defective ID. Therefore, the first two sectors are overwritten with data of a now ECC block, while the other two sectors remain to have the data of an old ECC block.

FIG. 22C illustrates the structure of reproduced data from the ECC block for which the overwrite operation failed. When the four sectors illustrated in FIG. 22B are reproduced, the new data and the old data are mixed with each other (in FIG. 22C, the new data and the old data are hatched in different directions). This means that an error correction always fails in the vertical direction using the outer code parity PO.

As can be appreciated from the description above, a block for which a recording operation even once failed becomes a block from which data cannot be reproduced. The read modified write operation is required to record data in some sectors of this block. However, a read modified write operation for such an unreproducible block will always fail. Thus, this block becomes a block on which data can no longer be recorded. Such a block cannot later be replaced by a replacement block because data to be transferred to the replacement block cannot be reproduced from the block, as in the read modified write operation.

If the dynamically expandable spare area was used with the ISO standard defect management method which is designed for use with a fixed-size spare area, the spare area may temporarily be exhausted (i.e., no available spare area), which would never happen in the conventional techniques. There is no method proposed in the art to manage a defective block which is detected while the spare area is temporarily exhausted. Since a read modified write operation for such an unmanaged defective block fails, data cannot be recorded by sectors in the defective block.

Also when recording/reproducing AV data on/from the disk, a read modified write operation for a skipped defective block fails, thereby experiencing the same problem as just described above.

SUMMARY OF THE INVENTION

According to one aspect of this invention, an information recording medium includes: a volume space in which user data is recorded; a spare area including a replacement area which may be used in place of a defective area included in the volume space; and a defect management information area in which defect management information for managing the defective area is recorded. The defect management information includes status information indicating whether the defective area is replaced by the replacement area.

In one embodiment of the invention, when a recording operation of the user data for the defective area is skipped, the status information indicating that the defective area is not replaced by the replacement area is written in the defect management information area.

In one embodiment of the invention, the spare area is an expandable area. When there are no available spare area in the replacement area temporarily, the status information indicating that the defective area is not replaced by the replacement area is written in the defect management information area.

In one embodiment of the invention, the defect management information includes first location information indicating a location of the defective area and second location information indicating a location of the replacement area. The status information indicates whether the defective area is replaced by the replacement area based on whether a value of the second location information is equal to a predetermined value.

In one embodiment of the invention, the defect management information includes first location information indicating a location of the defective area, second location information indicating a location of the replacement area, and a flag indicating whether the defective area is replaced by the replacement area. The status information indicates whether the defective area is replaced by the replacement area based on a value of the flag.

In one embodiment of the invention, the defective area is detected by ECC blocks each of which is a unit of an error correction operation. The defective area is replaced by the replacement area by ECC blocks.

According to another aspect of this invention, an information recording method for recording information on an information recording medium is provided. The information recording medium includes: a volume space in which user data is recorded; a spare area including a replacement area which may be used in place of a defective area included in the volume space; and a defect management information area in which defect management information for managing the defective area is recorded. The method includes the steps of: detecting the defective area; and recording status information indicating whether the defective area is replaced by the replacement area in the defect management information area.

In one embodiment of the invention, the method further includes the step of skipping a recording operation of the user data for the defective area. When the recording operation of the user data for the defective area is skipped, the status information indicating that the defective area is not replaced by the replacement area is written in the defect management information area.

In one embodiment of the invention, the spare area is an expandable area. The method further includes the step of detecting that the spare area temporarily runs out of available replacement areas. When there are no available spare area in the replacement area temporarily, the status information indicating that the defective area is not replaced by the replacement area is written in the defect management information area.

In one embodiment of the invention, the defect management information includes first location information indicating a location of the defective area and second location information indicating a location of the replacement area. The status information indicates whether the defective area is replaced by the replacement area based on whether a value of the second location information is equal to a predetermined value.

In one embodiment of the invention, the defect management information includes first location information indicating a location of the defective area, second location information indicating a location of the replacement area, and a flag indicating whether the defective area is replaced by the replacement area. The status information indicates whether the defective area is replaced by the replacement area based on a value of the flag.

In one embodiment of the invention, the defective area is detected by ECC blocks each of which is a unit of an error correction operation. The defective area is replaced by the replacement area by ECC blocks.

According to still another aspect of this invention, an information recording apparatus for recording information on an information recording medium is provided. The information recording medium includes: a volume space in which user data is recorded; a spare area including a replacement area which may be used in place of a defective area included in the volume space; and a defect management information area in which defect management information for managing the defective area is recorded. The apparatus includes: a detection section for detecting the defective area; and a recording section for recording status information indicating whether the defective area is replaced by the replacement area in the defect management information area.

In one embodiment of the invention, the apparatus further comprises a skip section for skipping a recording operation of the user data for the defective area. When the recording operation of the user data for the defective area is skipped, the recording section writes in the defect management information area the status information indicating that the defective area is not replaced by the replacement area.

In one embodiment of the invention, the spare area is an expandable area. The apparatus further includes a further detection section for detecting that the spare area temporarily runs out of available replacement areas. When there are no available spare area in the replacement area temporarily, the recording section writes in the defect management information area the status information indicating that the defective area is not replaced by the replacement area.

In one embodiment of the invention, the defect management information includes first location information indicating a location of the defective area and second location information indicating a location of the replacement area. The status information indicates whether the defective area is replaced by the replacement area based on whether a value of the second location information is equal to a predetermined value.

In one embodiment of the invention, the defect management information includes first location information indicating a location of the defective area, second location information indicating a location of the replacement area, and a flag indicating whether the defective area is replaced by the replacement area. The status information indicates whether the defective area is replaced by the replacement area based on a value of the flag.

In one embodiment of the invention, the defective area is detected by ECC blocks each of which is a unit of an error correction operation. The defective area is replaced by the replacement area by ECC blocks.

According to still another aspect of this invention, an information reproducing apparatus for reproducing information recorded on an information recording medium is provided. The information recording medium includes: a volume space in which user data is recorded; a spare area including a replacement area which may be used in place of a defective area included in the volume space; and a defect management information area in which defect management information for managing the defective area is recorded. The defect management information includes status information indicating whether the defective area is replaced by the replacement area. The apparatus includes: a determination section for determining whether the defective area is replaced by the replacement area with reference to the status information; and a control section for controlling a reproducing operation of the user data according to the determination.

In one embodiment of the invention, when the defective area is not replaced by the replacement area, the control section skips a reproducing operation for the defective area.

In one embodiment of the invention, when the defective area is not replaced by the replacement area, the control section outputs data having a fixed value as data obtained by reproducing the defective area, regardless of data in the defective area.

In one embodiment of the invention, the defective area is detected by ECC blocks each of which is a unit of an error correction operation. The defective area is replaced by the replacement area by ECC blocks. The error correction operation includes a first error correction operation for correcting errors within a single sector and a second error correction operation for correcting errors over a plurality of sectors. When the defective area is not replaced by the replacement area, the control section performs the first error correction operation, without performing the second error correction operation, for data in the defective area so as to output data which is corrected by the first error correction operation.

Thus, the invention described herein makes possible the advantages of: (1) providing an information recording medium where it is possible to manage a defective block even when there is no spare block available to replace the defective block so as to reduce the risk that the read modified write operation fails, thereby increasing the reliability; (2) providing an information recording method having such a feature; (3) providing an information recording apparatus having such a feature; and (4) providing an information reproducing apparatus having such a feature.

These and other advantages of the present invention will become apparent to those skilled in the art upon reading and understanding the following detailed description with reference to the accompanying figures.

BRIEF DESCRIPTION OF THE DRAWINGS

FIG. 23A is a diagram illustrating an exemplary format for a "SKIP WRITE" command;

FIG. 23B is a diagram illustrating another exemplary format for a "SKIP WRITE" command;

FIG. 24A is a diagram illustrating an exemplary format for a "REPORT SKIPPED ADDRESS" command; and FIG. 24B is a diagram illustrating an exemplary format for data which is reported in response to a "REPORT SKIPPED ADDRESS" command.

DESCRIPTION OF THE PREFERRED EMBODIMENTS

Various embodiments of the present invention will be described below with reference to the figures.

(Embodiment 1)

A disk 1 is a rewritable information recording medium. The disk 1 may be any type of information recording medium, including a DVD-RAM. Data can be recorded on the disk 1. The data recorded on the disk 1 can be reproduced therefrom. The recording and reproduction of the data is performed by sectors or by blocks.

Figure 17:
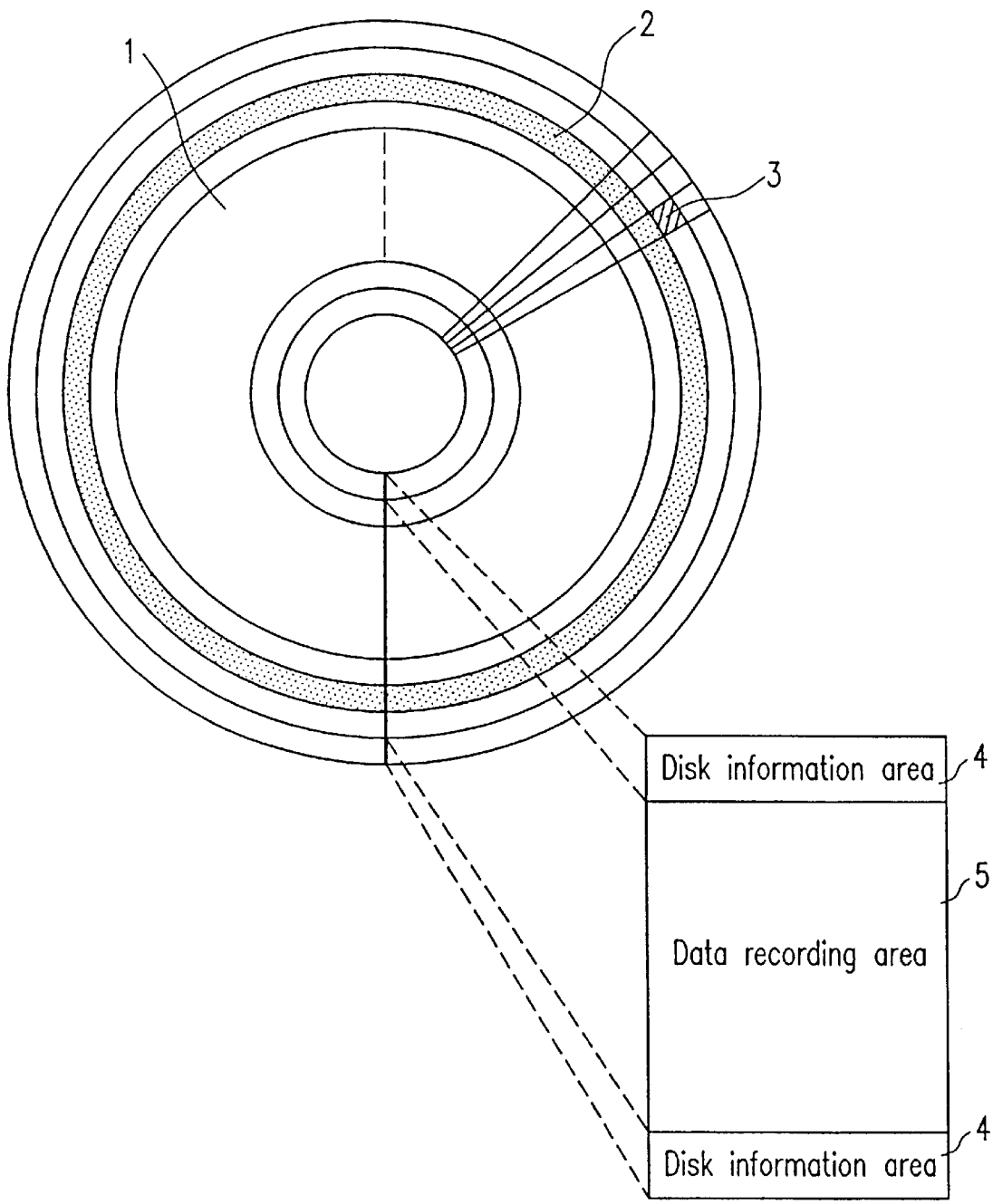
FIG. 17 is a diagram illustrating a physical structure of the disk 1.
Figure 18A:
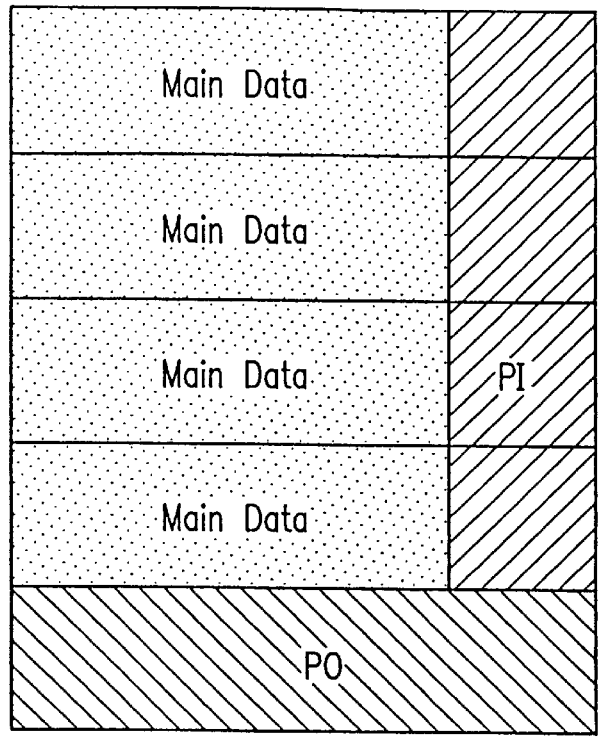
FIG. 18A is a diagram illustrating a structure of an ECC block which is a unit of error correcting code calculation.
Figure 18B:
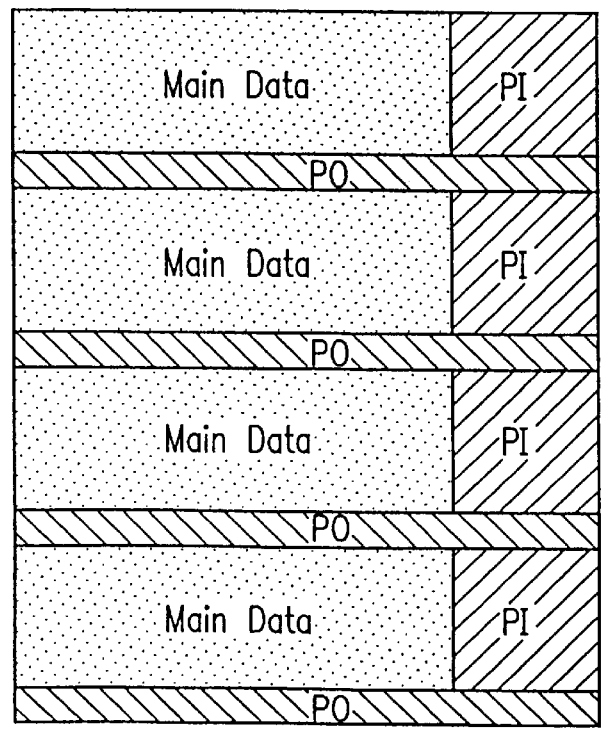
FIG. 18B illustrates an arrangement of sectors included in an ECC block.
Figure 19:
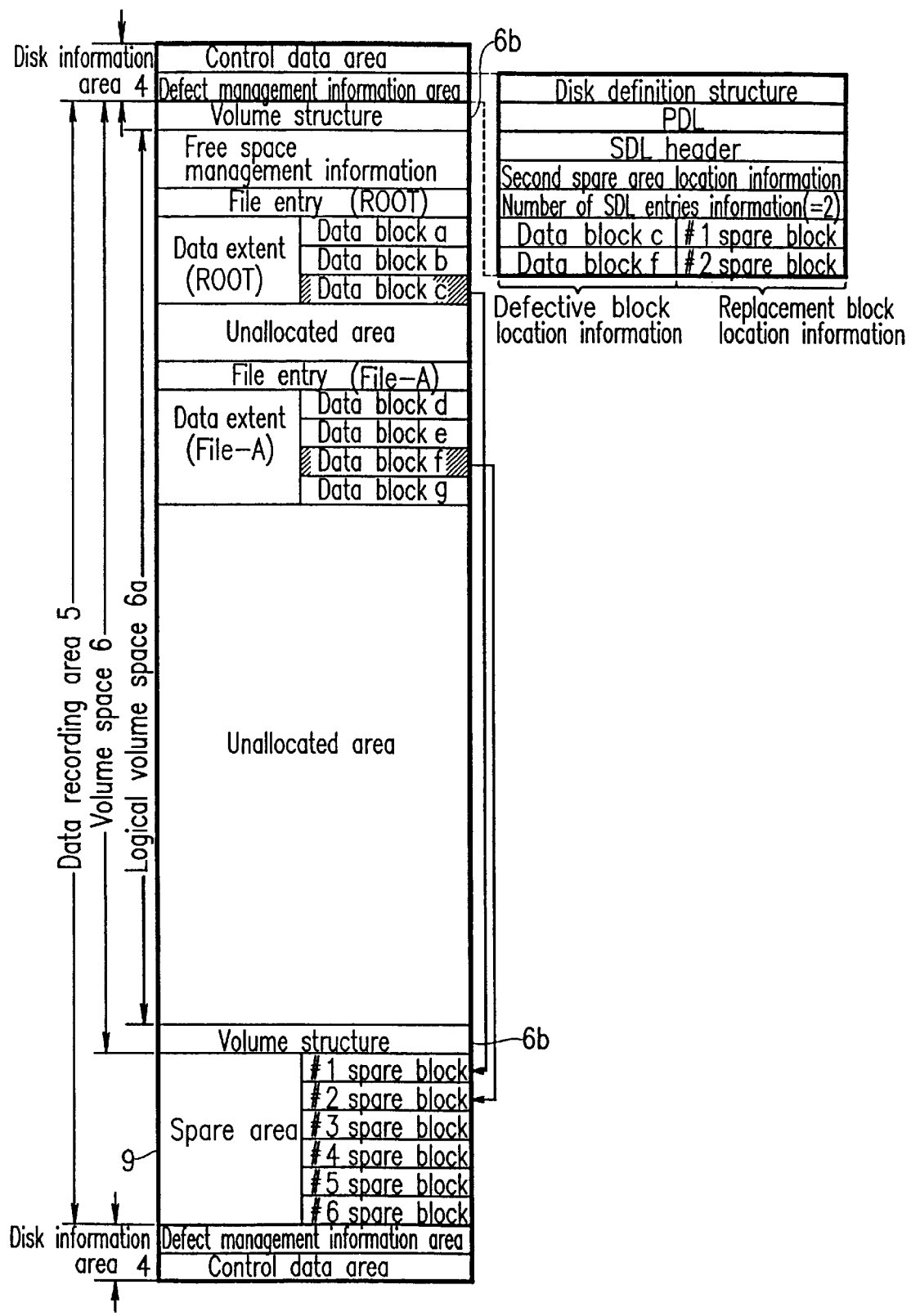
FIG. 19 illustrates an exemplary physical space of the disk 1 for use with a defect management method according to the ISO standard.
Figure 20A:
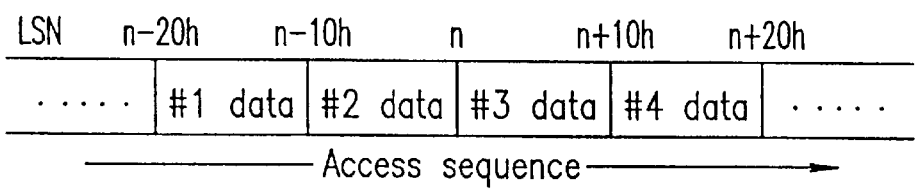
FIG. 20A illustrates an arrangement of AV data where there is no defective sector.
Figure 20B:
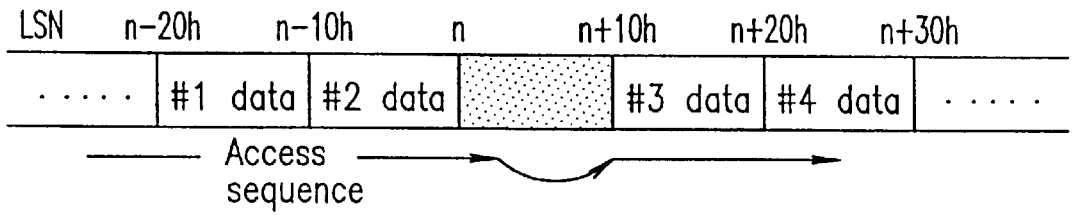
FIG. 20B illustrates an arrangement of AV data where there is a defective sector.
Figure 21:
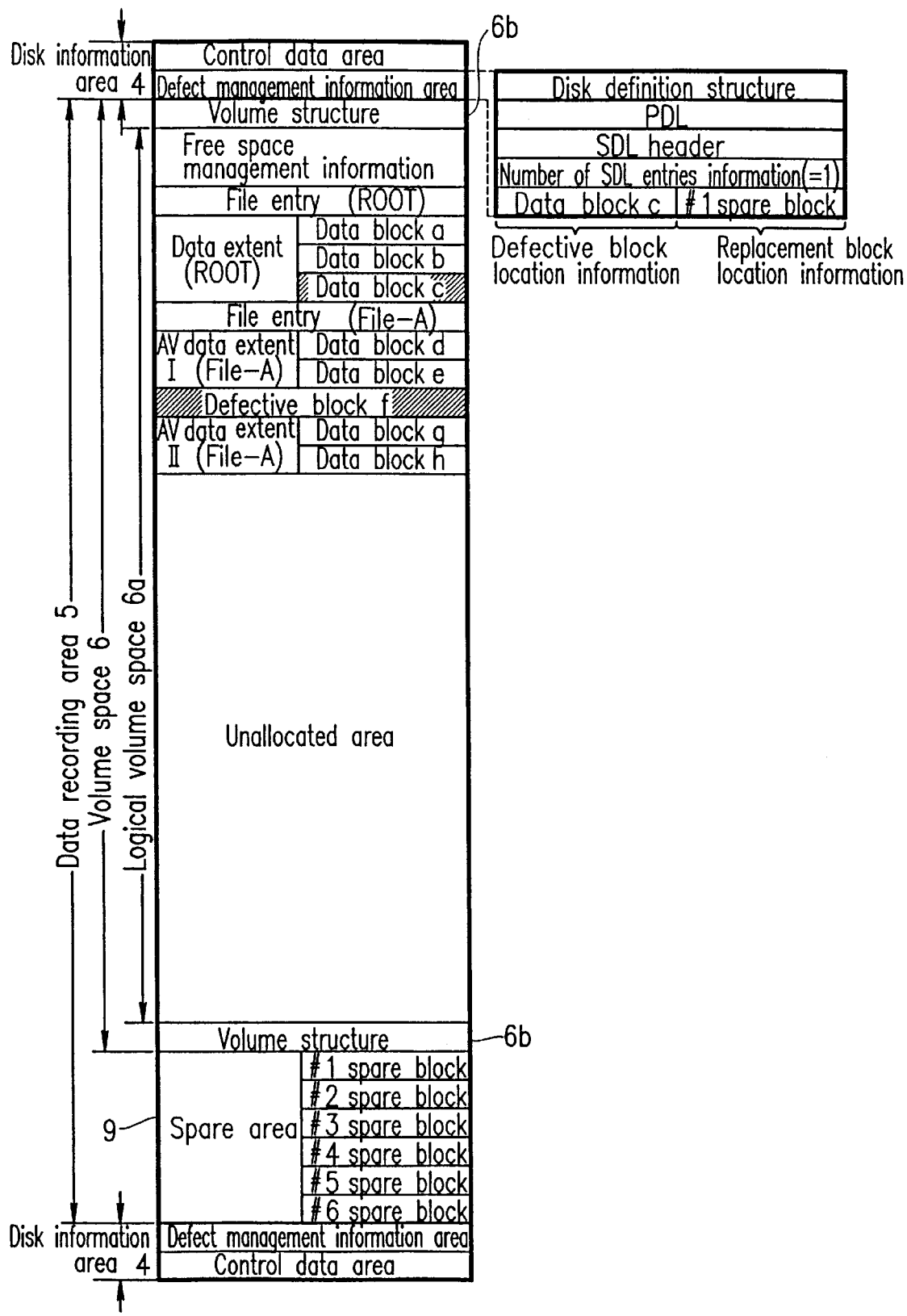
FIG. 21 illustrates an exemplary physical space of the disk 1 which is suitable for AV data recording/reproduction.

The physical structure of the disk 1 is the same as that illustrated in FIG. 17, and therefore will not further be described below.

Figure 1A:
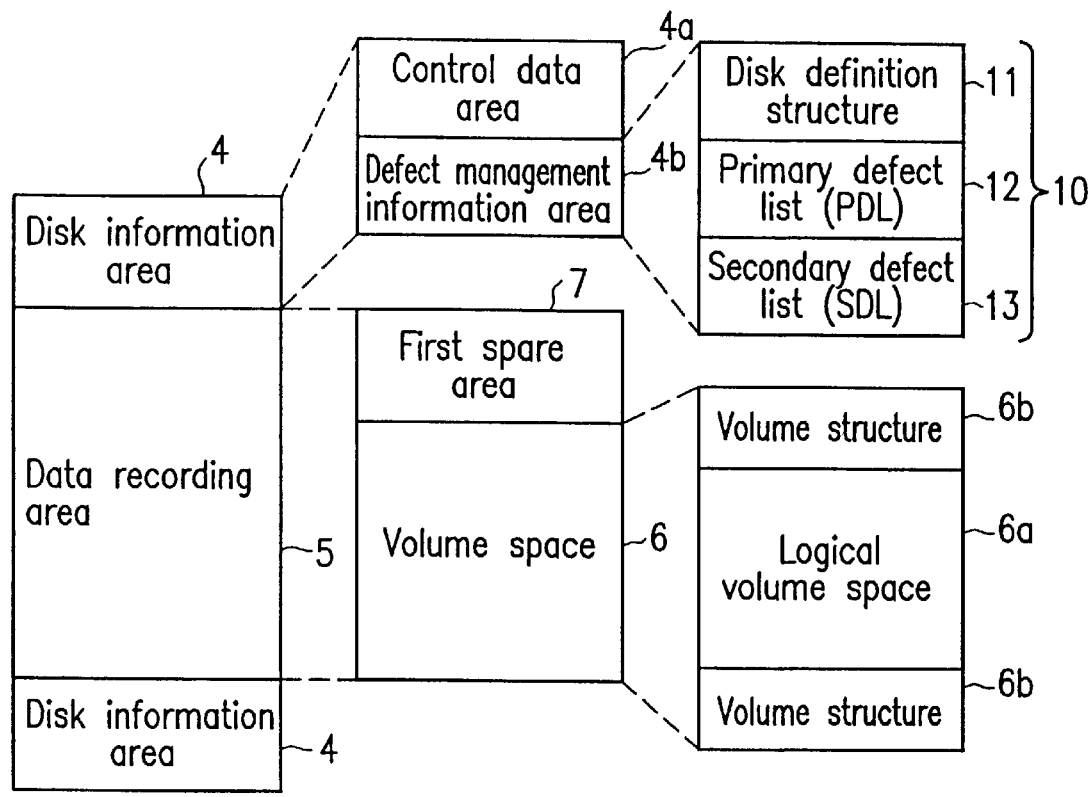
FIG. 1A is a diagram illustrating a structure of a physical space of a disk 1 which is an information recording medium according to Embodiment 1 of the present invention.

FIG. 1A illustrates a structure of the physical space of the disk 1. The disk 1 includes one or more disk information areas 4 and a data recording area 5. In the example illustrated in FIG. 1A, two disk information areas 4 are provided respectively along the inner and outer peripheries of the disk 1. The disk information area 4 along the inner periphery is also called a "lead-in" area, while the disk information area 4 along the outer periphery is also called a "lead-out" area.

Data is recorded/reproduced on/from the data recording area 5. Each sector in the data recording area 5 is assigned an absolute address which is called a physical sector number (hereinafter, abbreviated as a "PSN").

The data recording area 5 includes a volume space 6 and a first spare area 7.

The volume space 6 is an area provided for storing user data. Each sector included in the volume space 6 is assigned a logical sector number (hereinafter, abbreviated as an "LSN") for accessing the volume space 6. Data is recorded/reproduced by accessing each sector of the disk 1 using LSN.

The first spare area 7 includes at least one sector which may be used in place of a defective sector if such a defective sector occurs in the volume space 6. The first spare area 7 is arranged on the inner periphery side of the disk 1 with respect to the volume space 6, so that when a defective sector occurs in an area storing the file management information (free space management information, the file entry of the root directory. etc.), such a defective sector can be replaced quickly. The file management information is stored near the sector which is assigned an LSN "0". Thus, by arranging the first spare area 7 on the inner periphery side of the disk 1 with respect to the volume space 6, the seek distance between a defective sector and a replacement sector can be reduced. In this way, the speed of the defective sector replacement process is increased. Since the file management information is frequently accessed, the file management information requires high data reliability. Therefore, it is quite effective to quickly replace a defective sector which occurs in the area storing the file management information.

The volume space 6 includes a logical volume space 6a and logical volume structures 6b for storing information on the structure of the logical volume space 6a. The logical volume space 6a stores free space management information indicating whether a sector in the logical volume space 6a is used or free, one or more data extents storing the contents of the file, and a file entry in which one or more data extents corresponding to the file are registered. Each file is managed by using the various types of information.

The disk information area 4 includes a control data area 4a and a defect management information area 4b. The defect management information area 4b stores defect management information 10 for managing defective sectors.

The defect management information 10 includes a disk definition structure 11, a primary defect list (hereinafter, abbreviated as a "PDL") 12 and a secondary defect list (hereinafter, abbreviated as an "SDL") 13.

The PDL 12 is used to manage defective sectors which are detected during a pre-shipping inspection of the disk 1. The pre-shipping inspection of the disk 1 is usually conducted by the manufacturer of the disk 1.

The SDL 13 is used to manage defective sectors which are detected during use of the disk 1 by a user.

Figure 1B:
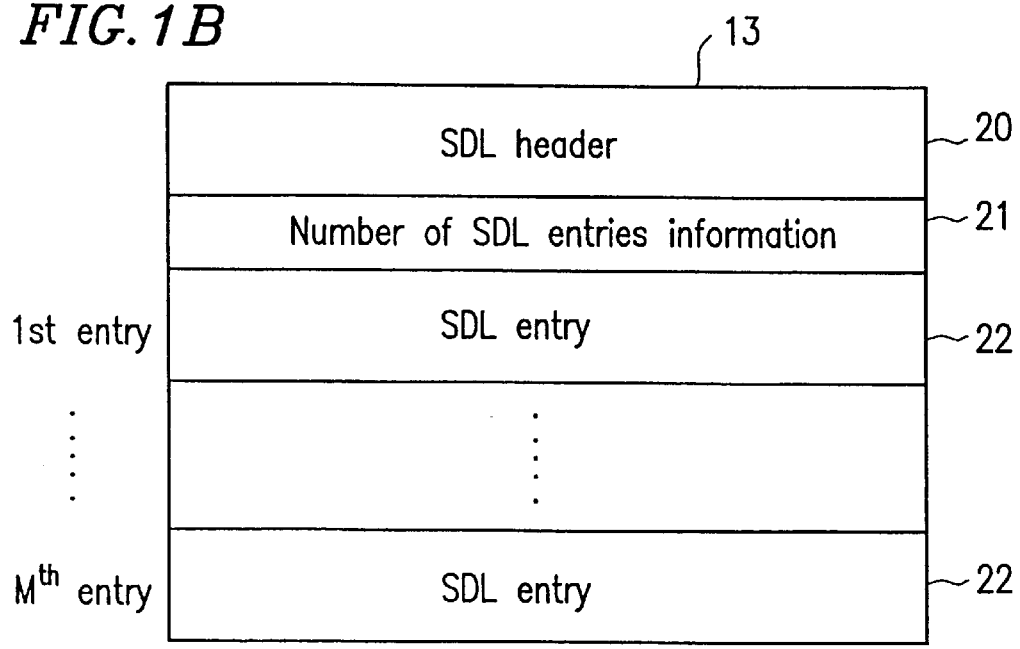
FIG. 1B is a diagram illustrating a structure of an SDL 13 illustrated in FIG. 1A.

FIG. 1B illustrates a structure of the SDL 13.

The SDL 13 includes: a secondary defect list header ("SDL header") 20 containing an identifier which identifies the list as an SDL; number of SDL entries information 21 indicating the number of SDL entries registered in the SDL; and one or more SDL entries 22 (1st entry to $m^{th}$ entry in the example illustrated in FIG. 1B). The number of SDL entries information 21 being "0" indicates that there is no defective sector registered in the SDL.

Figure 1C:
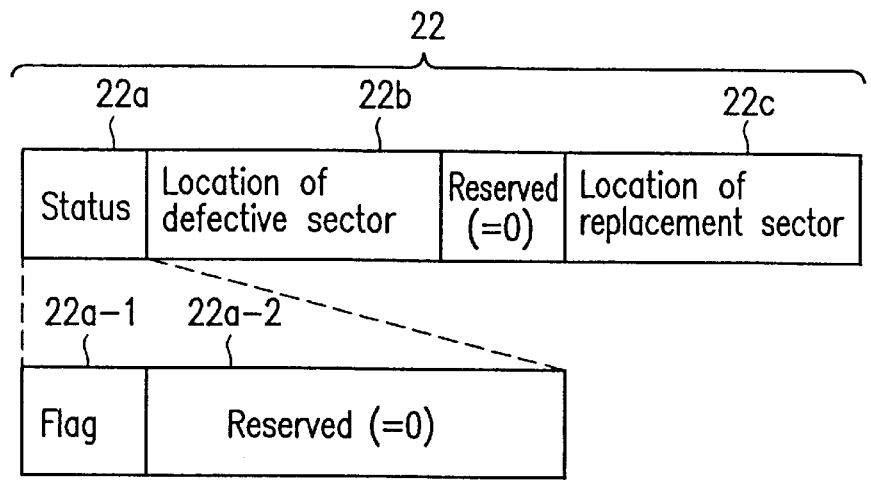
FIG. 1C is a diagram illustrating a structure of an SDL entry 22 in the SDL 13.

FIG. 1C illustrates a structure of the SDL entry 22.

The SDL entry 22 includes a status field 22a, a field 22b for storing information which indicates the location of the defective sector, and a field 22c for storing information which indicates the location of a replacement sector for the defective sector.

The status field 22a is used to indicate whether the defective sector is replaced by a replacement sector. The location of the defective sector is represented by, for example, the PSN of the defective sector. The location of the replacement sector is represented by, for example, the PSN of the replacement sector.

For example, the statue field 22a may include a 1-bit flag 22a-1 and a reserved area 22a-2. For example, the 1-bit flag 22a-1 being "1" may indicate that the defective sector is not replaced by a replacement sector, and it being "0" may indicate that the defective sector is replaced by a replacement sector.

Figure 1D:
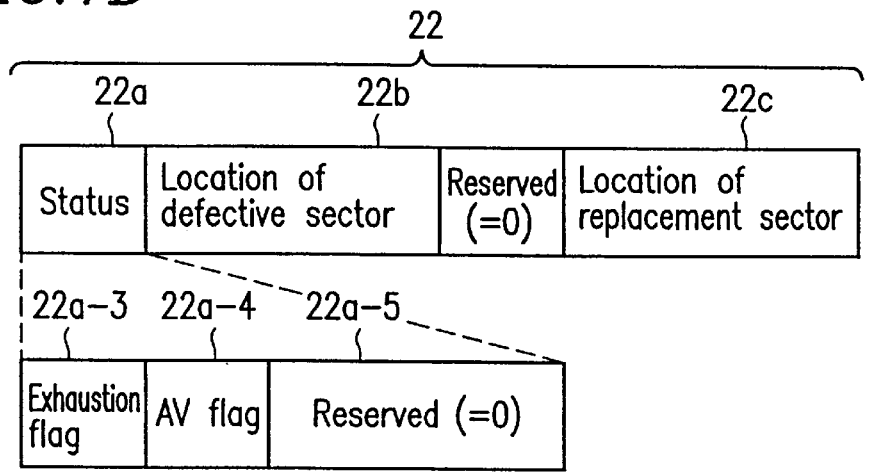
FIG. 1D is a diagram illustrating another structure of the SDL entry 22 in the SDL 13.

Alternatively, the status field 22a may include a 1-bit exhaustion flag 22a-3, a 1-bit AV flag 22a-4 and a reserved area 22a-5 (see FIG. 1D). Each of the exhaustion flag 22a-3 and the AV flag 22a-4 is a flag indicating the reason why the defective sector is not replaced by a replacement sector. For example, the exhaustion flag 22a-3 being "1" may indicate that the defective vector is not replaced by a replacement sector because the first spare area 7 is exhausted. For example, the AV flag 22a-4 being "1" may indicate that the defective sector is not replaced by a replacement sector because it is a defective sector which was detected while recording AV data on the disk 1.

Figure 1E:
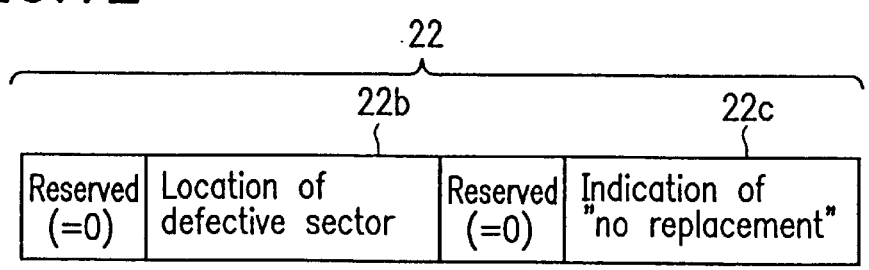
FIG. 1E is a diagram illustrating another structure of the SDL entry 22 in the SDL 13.

Instead of providing the status field 22a, a predetermined value, which indicates that "no replacement sector available i.e., the defective sector is not replaced by a replacement sector)", may alternatively be inserted in the field 22a which is for storing information indicating the location of a replacement sector (see FIG. 1E). The predetermined value may be "0", for example.

FIGS. 1C to 1E are only exemplary, and the format for the SDL entry 22 is not limited to those illustrated in FIGS. 1C to 1E. The SDL entry 22 may take any format as long as the SDL includes the status information which indicates whether the defective sector is replaced by a replacement sector.

For example, by setting the field 22c to a predetermined value while the status field 22a is being "1", it is possible to increase the number of statuses which can be distinguished from one another. For example, the field 22c being set to "0" may indicate that a newly detected defective sector is not replaced by a replacement sector, and the replacement sector has not been assigned. For example, the field 22c being set to a value other than "0" may indicate that a previously detected defective sector was replaced by the replacement sector, that is specified by the field 22c, but the replacement is cancelled.

While the defect management is performed by sectors in the above-described example, the defect management may alternatively be performed by blocks each including a plurality of sectors. In such a case, information indicating the location of a defective block (rather than a defective sector; e.g., the PSN of the leading sector of the defective block), and information indicating the location of a replacement block (rather than a replacement sector; e.g., the PSN of the leading sector of the replacement block) may be registered in the SDL. It is alternatively possible to perform defect management by ECC blocks each of which is a unit of an error correction operation.

Thus, by storing in the defect management information area, status information which indicates whether a defective area (a defective sector or a defective block) is replaced by a replacement area (a replacement sector or a replacement block), it is possible to manage the status where a defective area has been detected but is not replaced by a replacement area.

Figure 2:
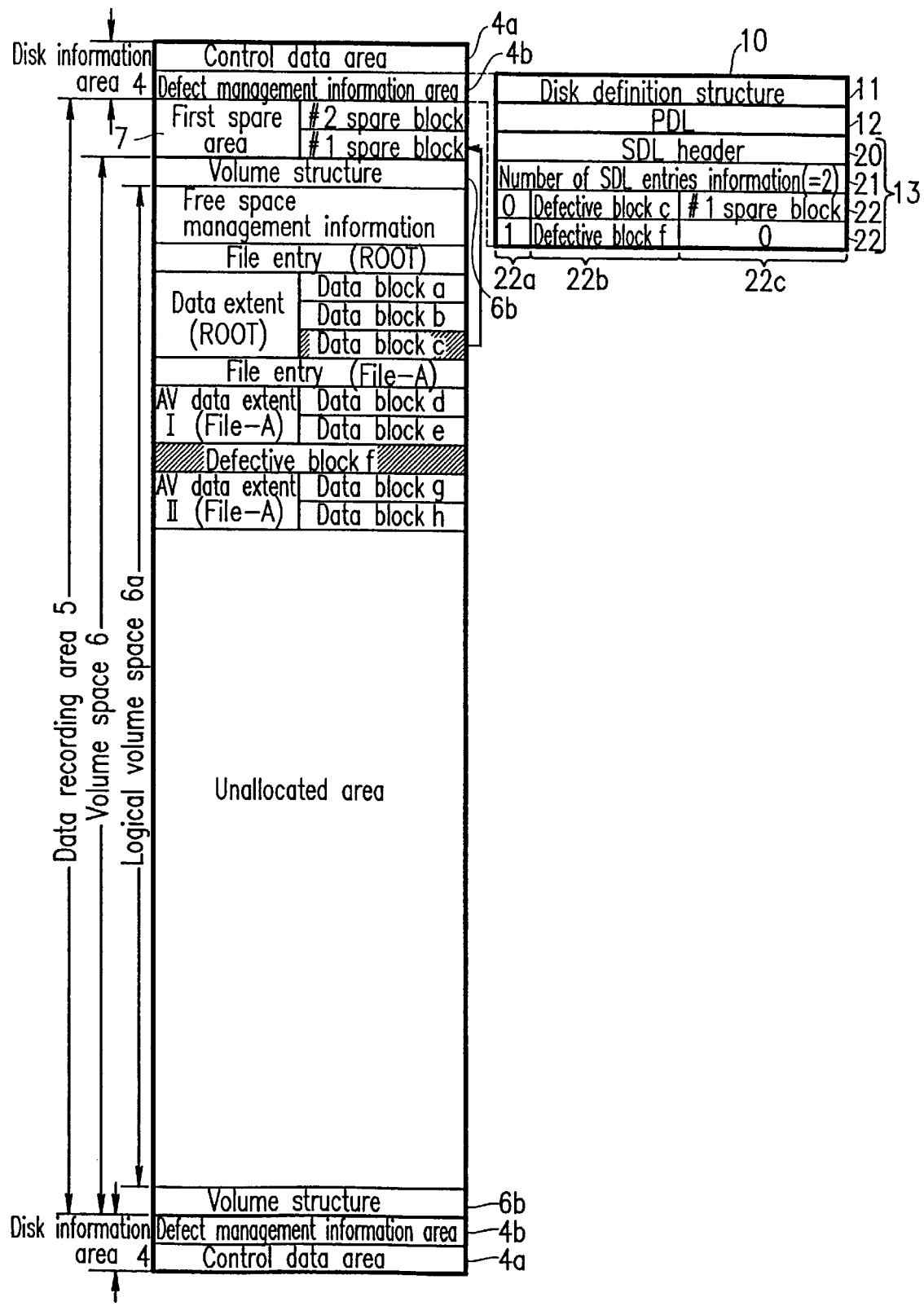
FIG. 2 is a diagram illustrating an exemplary physical space of the disk 1 where a file A containing AV data is recorded on the disk 1.

FIG. 2 illustrates an exemplary physical space of the disk 1 where a file A containing AV data is recorded on the disk 1.

In the example illustrated in FIG. 2, a file A (indicated as "File-A" in FIG. 2) exists directly under a root directory (indicated as "ROOT" in FIG. 2). Among data blocks a to c included in the data extent of the root directory, the data block c is defective. The defective block c is replaced by #1 spare block in the first spare area 7. It is assumed that a defective block f is detected while recording the AV data extent of the file A in an area provided for the AV data extent. In such a case, the defective block f is skipped. As a result, the AV data extent of the file A is recorded while being divided into an AV data extent I (File-A) (including the data blocks d and e) and another AV data extent II (File-A) (including the data blocks g and h).

The first SDL entry 22 in the SDL 13 indicates that the defective block c is replaced by #1 spare block in the first spare area 7.

The second SDL entry 22 in the SDL 13 indicates that the defective block f (which was detected while recording AV data on the disk 1 and thus skipped) is not replaced by a replacement block.

Figure 3:
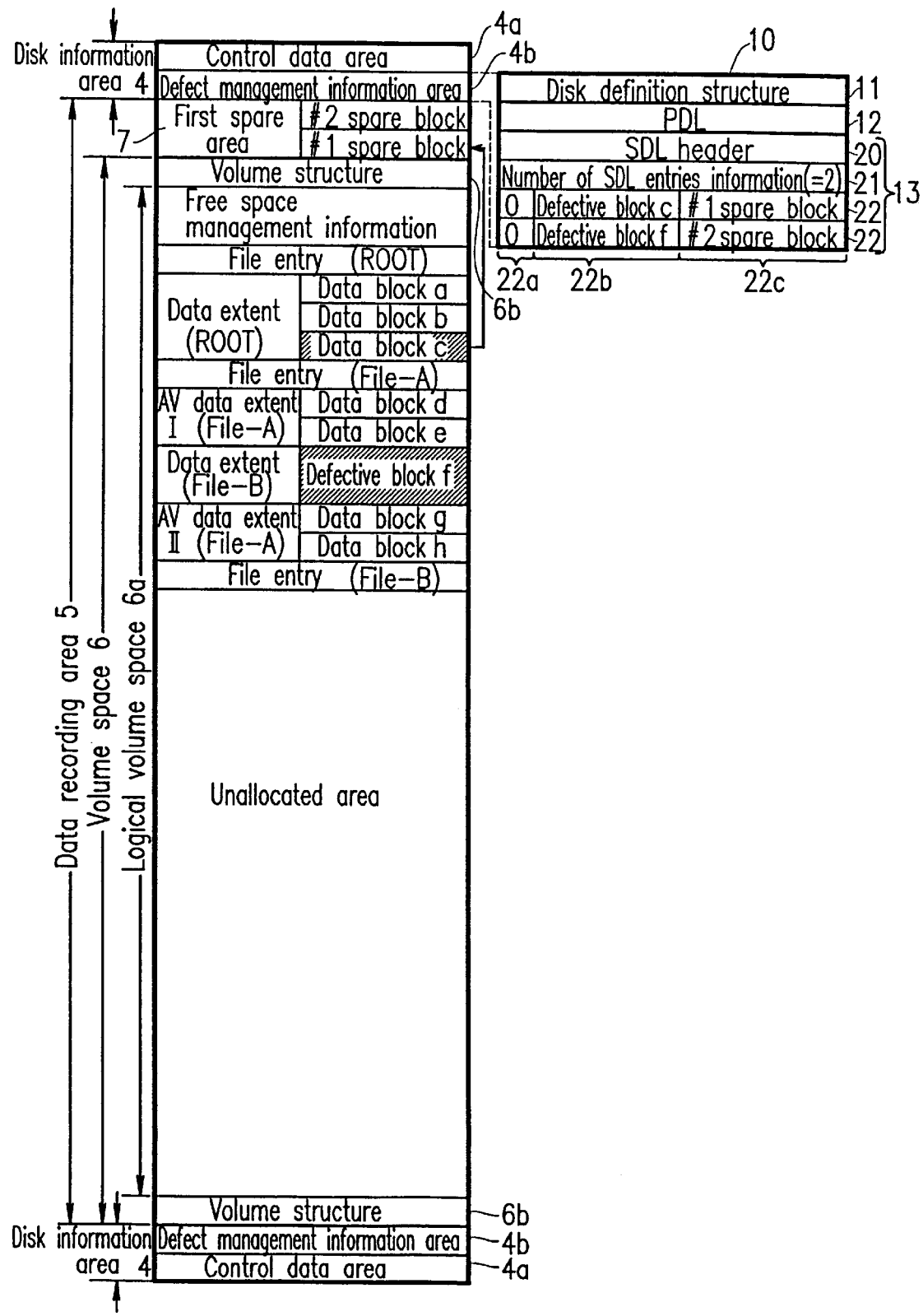
FIG. 3 is a diagram illustrating an exemplary physical space of the disk 1 where the file A containing AV data and then a file B containing non-AV data are recorded on the disk 1.

FIG. 3 illustrates an exemplary physical space of the disk 1 where the file A containing AV data and then a file B containing non-AV data (i.e., a type of data other than AV data) are recorded on the disk 1.

In the example Illustrated in FIG. 3, the defective block f is designated as a location where the data extent of the file B is to be recorded. As a result, the defective block f is replaced by #2 spare block in the first spare area 7. Along with this replacement process, the value in the status field 22a of the second SDL entry 22 in the SDL 13 is changed from "1" to "0", and information which indicates the location of #2 spare block is stored in the field 22c thereof.

It is assumed that the size of the data extent of the file B is equal to the size of one block. The structure information of the data extent of the file B is described in the file entry of the File B. LSNs corresponding to the file B are described as "used" in the free space management information. The file B is registered in the data extent of the root directory.

If the optical disk apparatus attempts to record data in some sectors of the defective block f, not knowing that the defective block f is a defective block for which an AV data recording operation failed, the result will not be the same as described above for the following reason. The optical disk apparatus performs a read modified write operation so as not to change data in other sectors belonging to the same ECC block as the sector for which a recording operation is requested. The optical disk apparatus attempts to perform the data reproduction step of the read modified write operation in the ECC block, but always fails. As a result, it is not possible to obtain data in the unit of ECC blocks, as required to record the data in a spare block. Thus, replacement cannot even be made.

If the optical disk apparatus knows that the defective block f is a defective block for which an AV data recording operation failed, it can determine that no effective user data is recorded in the defective block f. Such a determination can be made because AV data, which is required to be recorded in a real time manner, needs to be recorded on the disk 1 by ECC blocks. in other words, the optical disk apparatus is never requested to rewrite only some of the sectors in an ECC block. Therefore, a read modified write operation (for rewriting only the sector for which a recording operation is requested without changing data in the other sectors belonging to the same ECC block) is not required for a skipped defective block. Thus, it is possible to create an ECC block by filling the other sectors with "0"s and to record the created ECC block in a replacement spare block.

Figure 4:
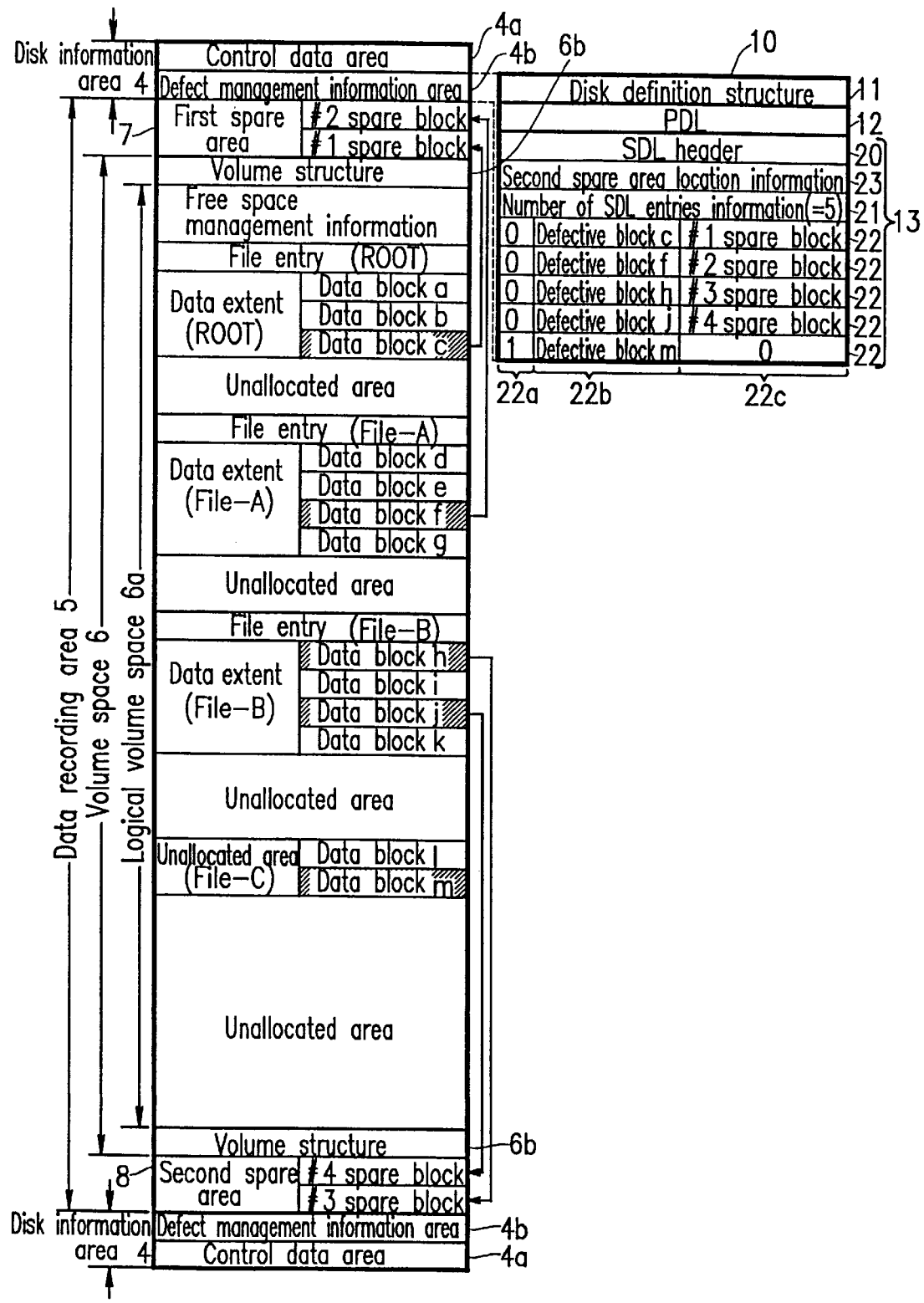
FIG. 4 is a diagram illustrating an exemplary physical space of the disk 1 where the spare area is temporarily exhausted (i.e., out of available replacement areas)

FIG. 4 illustrates an exemplary physical space of the disk 1 where the spare area is temporarily exhausted (i.e., out of available replacement areas).

As compared to the physical space illustrated in FIG. 2, an expandable second spare area 8 is additionally allocated in the data recording area 5. Along with the allocation of the second spare area 8, the size of the volume space 6 and the size of the logical volume space 6a are reduced according to the size of the second spare area 8. Prior to the allocation of the second spare area 8, the volume structure 6b along the outer periphery of the disk 1 is moved toward the inner periphery of the disk 1. The size of the free space management information is adjusted according to the size of the logical volume space 6a.

in the example illustrated in FIG. 4, a file A (indicated as "File-A" in FIG. 4), a file B (indicated as "File-B" in FIG. 4), and a file C (indicated as "File-C" in FIG. 4), which is now being recorded, exist directly under a root directory (indicated as "ROOT" in FIG. 4).

A data block c included in the data extent of the root directory is defective. The defective block c is replaced by #1 spare block in the first spare area 7.

A data block f included in the data extent of the file A is defective. The data block f is replaced by #2 spare block in the first spare area 7.

Data blocks h and j included in the data extent of the file B are defective. The data blocks h and j are replaced respectively by #3 spare block and #4 spare block in the second spare area 8. When a data block m was to be recorded as the data extent of the file C, the data block m was detected as a defective block during the recording operation, and no available spare block existed in the first spare area 7 or in the second spare area 8. Thus, the file C is incomplete.

As compared to the structure of the SDL 13 illustrated in FIG. 1B, the SDL 13 is additionally provided with a field 23 for storing information which indicates the location of the second spare area 8. For example, the PSN of the leading sector of the second spare area 8 may be stored in the field 23 as the information indicating the location of the second spare area 8. The field 23 is provided for dynamically expanding the second spare area 8.

The first SDL entry 22 in the SDL 13 indicates that the defective block c is replaced by #1 spare block in the first spare area 7.

The second SDL entry 22 in the SDL 13 indicates that the defective block f is replaced by #2 spare block in the first spare area 7.

The third SDL entry 22 in the SDL 13 indicates that the defective block h is replaced by #3 spare block in the second spare area 8.

The fourth SDL entry 22 in the SDL 13 indicates that the defective block j is replaced by #4 spare block in the second spare area 8.

The fifth SDL entry 22 in the SDL 13 indicates that the defective block m is not replaced by a spare block.

Figure 5:
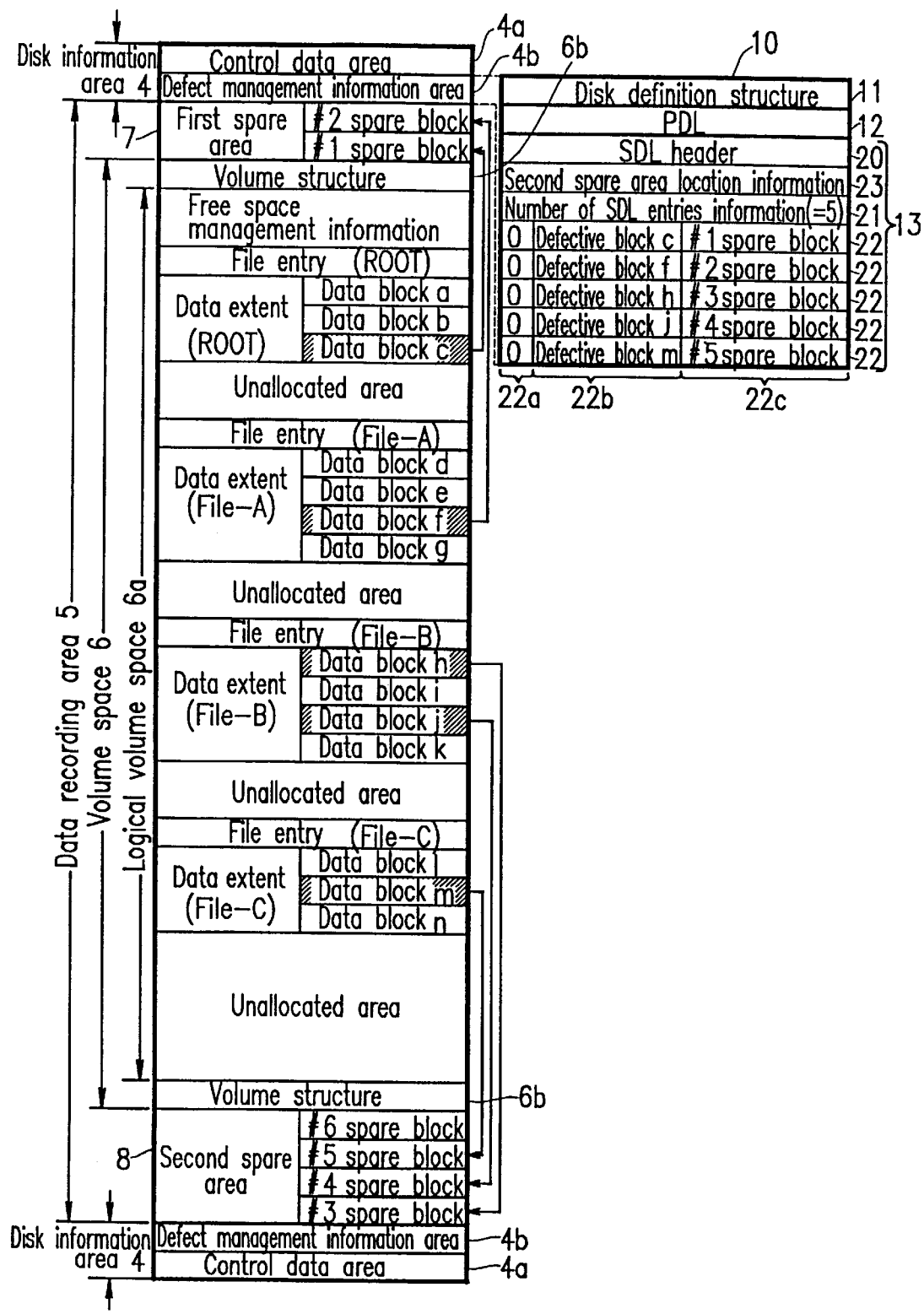
FIG. 5 is a diagram illustrating an exemplary physical space of the disk 1 where a file C recording operation is retried after expanding a second spare area 8.

FIG. 5 illustrates an exemplary physical space of the disk 1 where the file C recording operation is retried after expanding the second spare area 8.

As illustrated in FIG. 5, the second spare area 8 has been expanded. The size of the volume space 6 and the size of the logical volume space 6a are reduced according to the expansion of the second spare area 8.

Prior to the expansion of the second spare area 8, the volume structure 6b along the outer periphery of the disk 1 is moved toward the inner periphery of the disk 1. The size of the free space management information is adjusted according to the size of the logical volume space 6a.

The data block m included in the data extent of the file C is replaced by #5 spare block in the expanded second spare area 8. The data extent of the file C includes three data blocks l, m and n. The structure information of the data extent of the file C is described in the file entry of the file C. LSNs corresponding to the file C are described as "used" in the free space management information. The file C is registered in the data extent of the root directory.

The fifth SDL entry 22 in the SDL 13 indicates that the data block m is replaced by #5 spare block in the expanded second spare area 8.

Unlike when an AV data recording operation fails, when a non-AV data recording operation fails, the defective block may contain effective user data. A recovery process for such a defective block is somewhat more complicated than in the case where the defective block does not contain effective user data.

It is assumed that the optical disk apparatus is requested to record data in a sector included in a defective block (ECC block) to which no replacement block has been allocated. In such a case, the optical disk apparatus reproduces data from the other sectors in the ECC block which includes the sector by using only the inner code parities PI (see FIG. 22C) which are independently provided for the respective sectors, and performs a read modified write operation using the reproduced data.

In this way, although the error correction capability is reduced because the outer code parity PO is not used, it is possible to correct errors to the extent the errors are correctable only with the inner code parity PI.

Where a defective block to which no replacement block has been allocated is registered in the SDL only when there is no effective user data in the defective block, a defective block recovery process to be performed is similar to that described above which is performed after failure of an AV data recording operation.

As described above, when a defective area is detected while recording data which requires real time processing (e.g., AV data). the data is not recorded in the defective area (i.e., the defective area is skipped). The location of the defective area is written in the defect management information area 4b of the disk 1. Moreover, status information indicating that the defective area is not replaced by a replacement area is also written in the defect management information area 4b of the disk 1. When it is requested to record data which does not require real time processing (e.g., non-AV data) in the defective area, the defective area is replaced by a replacement area without performing a read modified write operation. The location of the replacement area is written in the defect management information area 4b of the disk 1.

Thus, by replacing a defective area with a replacement area while avoiding a read modified write operation which is known to always fall, it is possible to successfully record data which does not require real time processing in the replacement area.

Moreover, a replacement area is not allocated to a defective area until it is actually requested to record data in the defective area. This provides an advantage in that no replacement area is wasted.

Where a spare area is expandable, the spare area may temporarily run out of available replacement areas. When no replacement area can be allocated to a detected defective area because the spare area is temporarily out of available replacement areas, the location of the defective area is written in the defect management information area 4b of the disk 1. Moreover, status Information indicating that the defective area is not replaced by a replacement area (no replacement area has been allocated thereto) is written in the defect management information area 4b of the disk 1. After the spare area is expanded and a replacement area is made available, the replacement area is allocated to the defective area and the defective area is replaced by the replacement area. The location of the replacement area is written in the defect management information area 4b of the disk 1.

in the above-described information recording medium, a replacement area is not allocated to a defective area upon detection of the defective area, but it is allocated thereto only when effective data is recorded in a logical volume space which corresponds to the defective area. Such an information recording medium has an advantage in that the spare area can be efficiently used.

Moreover, the advantage of efficiently using the spare area is not dependent upon the structure of the error correcting code which requires a read modified write operation.

(Embodiment 2)

An embodiment of an information recording/reproducing system for recording information on, or reproducing recorded information from, the disk 1 as described in Embodiment 1 above will now be described with reference to the figures.

Figure 6:
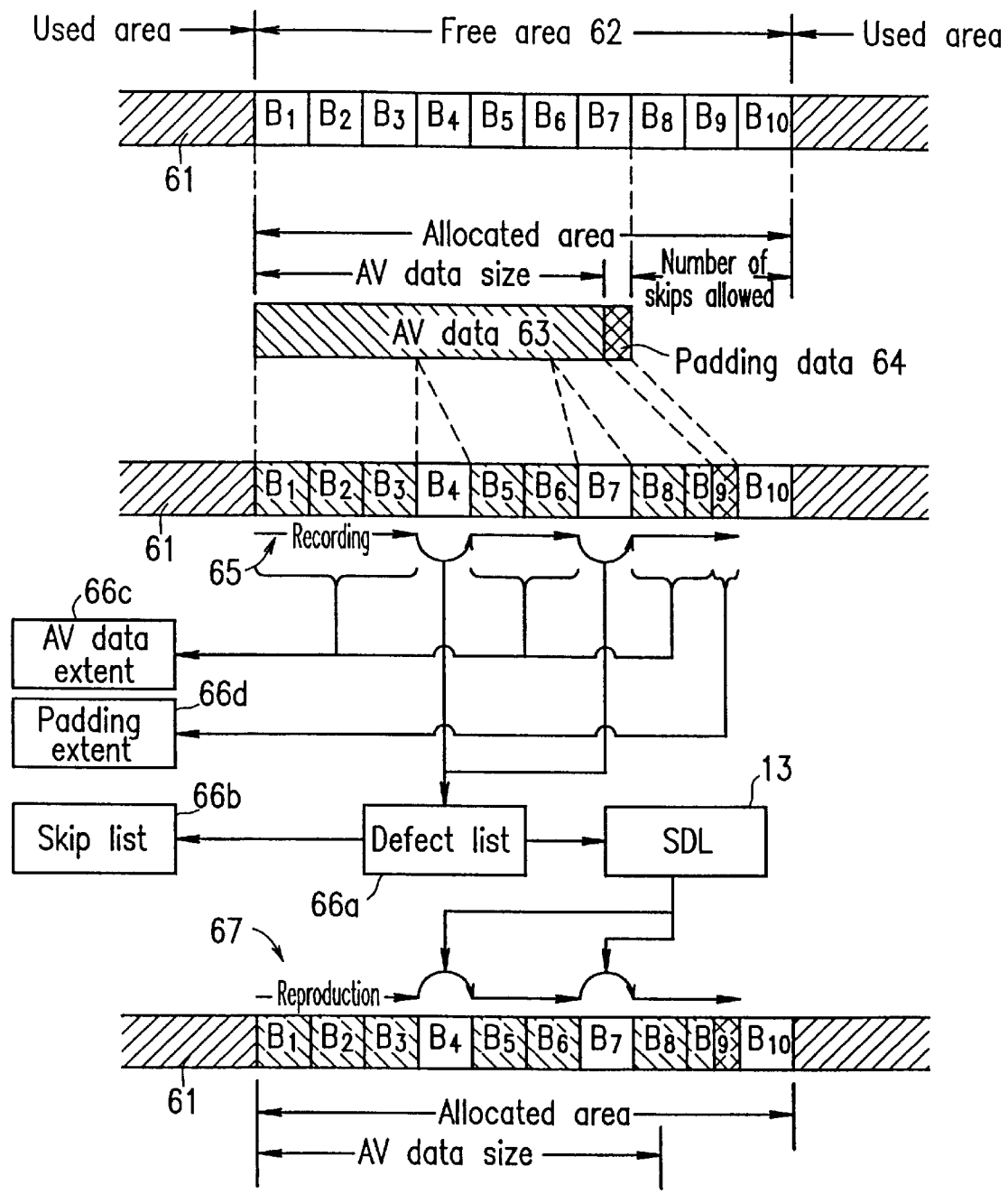
FIG. 6 is a conceptual diagram illustrating a principle of recording AV data on, or reproducing recorded AV data from, the disk 1.

FIG. 6 is a conceptual diagram illustrating a principle of recording AV data on, or reproducing recorded AV data from, the disk 1.

AV data is recorded on the disk 1 with reference to the free space management information in the logical volume space. The system searches for a free area in the logical volume space based on the free space management information. The number of blocks of the continuously free area needs to be greater than the number of blocks required for the AV data to be recorded by at least a predetermined number. The predetermined number corresponds to the number of blocks for which a skip operation is to be allowed. When a free area satisfying such a condition is found, the free area is allocated to the AV data.

In the example illustrated in FIG. 6, a free area 62 included in an area 61 is allocated to AV data 63. The area 61 is a part of the logical volume space 6a. The free area 62 includes blocks $B_1$ to $B_{10}$.

Parameters for a skip recording instruction are produced based on the size of the free area 62 which is allocated to the AV data 63 (i.e., the size of the allocated area) and the size of the AV data 63 (i.e., the AV data size).

Reference numeral 65 denotes a recording operation performed when a skip recording instruction is executed.

Defective block detection is performed while recording the AV data 63 in the free area 62. The AV data 63 is recorded in the free area 62 while skipping each defective block detected. In the example illustrated in FIG. 6, the blocks $B_4$ and $B_7$ are defective. Therefore, a portion of the AV data 63 is recorded in the blocks $B_1$–$B_2$, another portion of the AV data 63 is recorded in the blocks $B_5$–$B_6$, and the remaining portion of the AV data 63 to recorded in the blocks $B_8$–$B_9$. Following the AV data 63, padding data 64 is recorded in the block $B_9$. The padding data 64 is provided so that the end of the padding data 64 coincides with a block boundary. As a result of the recording operation, the blocks $B_1$–$B_3$, $B_5$–$B_6$ and $B_8$–$B_9$ become "used", while the other blocks $B_4$, $B_7$ and $B_{10}$ remain "free".

The locations of the defective blocks $B_4$ and $B_7$ are stored in a defect list 66a. The contents of the defect list 66a are written in the SDL 13 in the defect management information area 4b of the disk 1 at any appropriate time, and are reported to the file system as a skip list 66b as necessary. Based on the reported skip list 66b, the file system determines the location of an AV data extent 66c which indicates the area where the AV data 63 is recorded, and the location of a padding extent 66d which indicates the ECC block fraction (i.e., sectors having no AV data in an ECC block partially including AV data), so as to update the file management information.

Parameters for a skip reproducing instruction include the size of the allocated area and the AV data size.

Reference numeral 67 denotes a reproducing operation performed when a skip reproducing instruction is executed.

The AV data 63 recorded on the disk 1 is reproduced with reference to the SDL 13. The AV data 63 is reproduced while skipping the defective blocks registered in the SDL 13.

Figure 7:
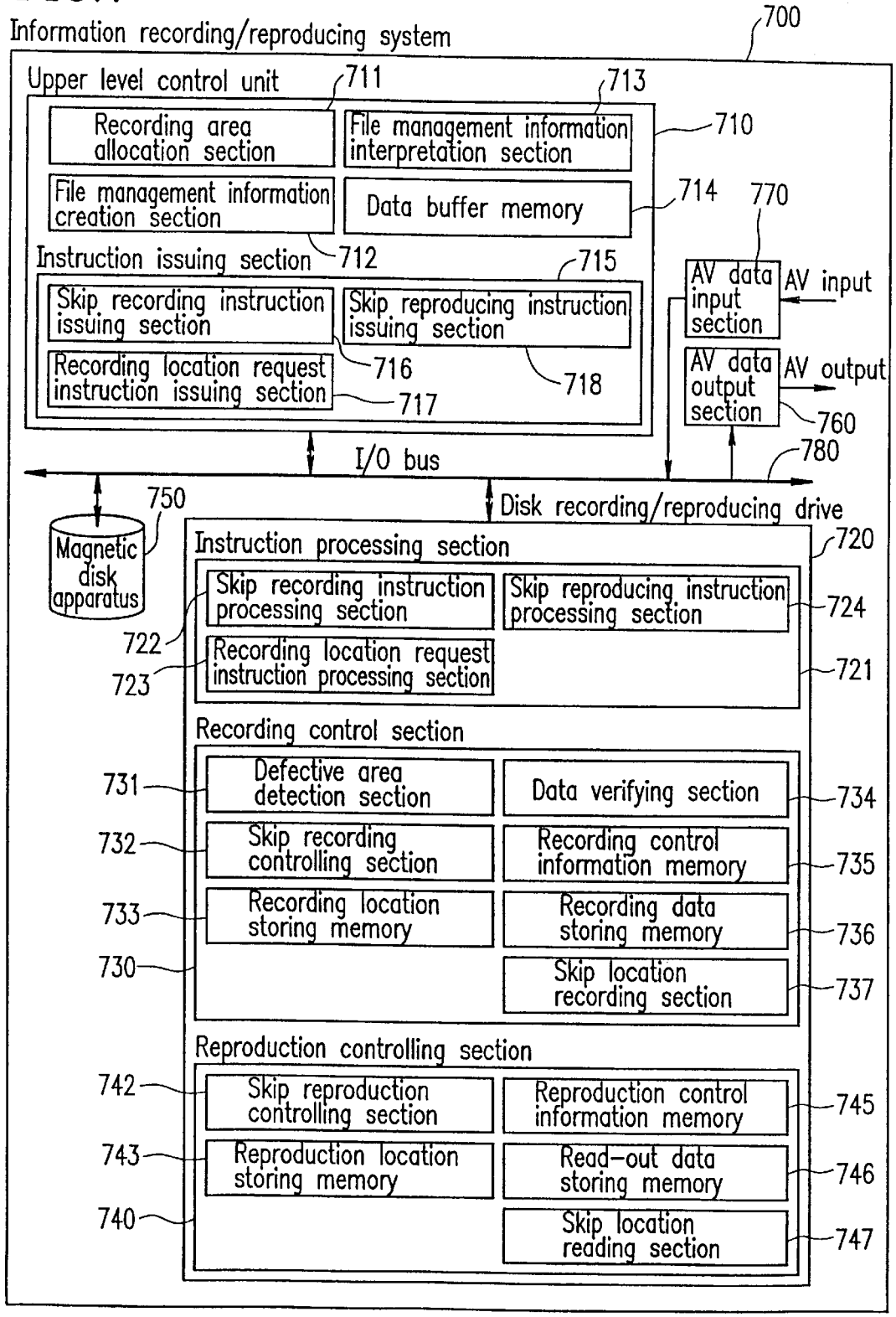
FIG. 7 is a block diagram illustrating a structure of an information recording/reproducing system 700 according to Embodiment 2 of the present invention.

FIG. 7 is a block diagram illustrating a structure of an information recording/reproducing system 700 according to Embodiment 2 of the present invention.

As illustrated in FIG. 7, the information recording/reproducing system 700 includes: an upper level control unit 710 for controlling the overall system; a disk recording/reproducing drive 720 for controlling the recording/reproduction of the rewritable disk 1 (not shown in FIG. 7) according to the instruction from the upper level control unit 710; a magnetic disk apparatus 750; an AV data output section 760 for converting digital AV data to an analog AV signal and outputting the analog AV signal; an AV data input section 770 for converting the input analog AV signal to digital AV data; and an I/O bus 780 for receiving/transmitting data and control information.

The upper level control unit 710 includes a microprocessor in which a control program and an arithmetic memory are provided. The upper level control unit 710 further includes: a recording area allocation section 711 for allocating a recording area when recording data; a file management information creation section 712 for creating file management information for each recorded file; a file management information interpretation section 713 for calculating the location where the file is recorded and determining the attribute information of the file based on the file management information; a data buffer memory 714 for temporarily storing data; and an instruction issuing section 715 for issuing an instruction to the disk recording/reproducing drive 720.

The instruction issuing section 715 includes: a skip recording instruction issuing section 716 for issuing a skip recording instruction which requests data to be recorded while skipping defective areas; a recording location request instruction issuing section 717 for issuing a recording location request instruction which requests recording location information to be returned (the information is used after data is recorded to determine the area where the data has been recorded); and a skip reproducing instruction issuing section 718 for issuing a skip reproducing instruction which requests data to be reproduced while skipping defective areas.

The disk recording/reproducing drive 720 includes a microprocessor in which a control program and an arithmetic memory are provided. The disk recording/reproducing drive 720 is made of a mechanical section, a signal processing circuit, etc., which are controlled by the microprocessor. The disk recording/reproducing drive 720 operatively includes: an instruction processing section 721 for processing an instruction from the upper level control unit 710; a recording control section 730 for controlling the recording operation on the rewritable disk 1; and a reproduction controlling section 740 for controlling the reproducing operation from the rewritable disk 1.

The instruction processing section 721 includes: a skip recording instruction processing section 722 for processing a skip recording instruction; a recording location request instruction processing section 723 for processing a recording location request instruction; and a skip reproducing instruction processing section 724 for processing a skip reproducing instruction.

The recording control section 730 includes: a defective area detection section 731 for detecting a defective area during a recording operation; a skip recording controlling section 732 for recording data while skipping defective areas which are detected during the recording operation; a recording location storing memory 733 for storing information relating to the location where data is recorded; a data verifying section 734 for reading out recorded data so as to determine whether the data has been normally recorded; a recording control information memory 735 for storing control information (e.g., the recording start location, and the recording length) which is required when recording data; a recording data storing memory 736 for temporarily storing recording data received from the upper level control unit 710; and a skip location recording section 737 for recording a defective area, which has been detected and skipped during a recording operation, in the defect management information.

The reproduction controlling section 740 includes: a reproduction location storing memory 743 for storing information relating to the location from which data is reproduced; a skip reproduction controlling section 742 for reproducing data while skipping defective areas with reference to the reproduction location storing memory 743; a reproduction control information memory 745 for storing control information (e.g., the reproduction start location, and the reproduction length) which is required when reproducing data; a read-out data storing memory 746 for temporarily storing data which has been read out from the rewritable disk 1; and a skip location reading section 747 for reading out the location of a defective area to be skipped from the defect management information and storing it in the reproduction location storing memory 743.

Next, a method for recording a file containing AV data on the disk 1 using the information recording/reproducing system 700 illustrated in FIG. 7 will be described below.

Figure 8:
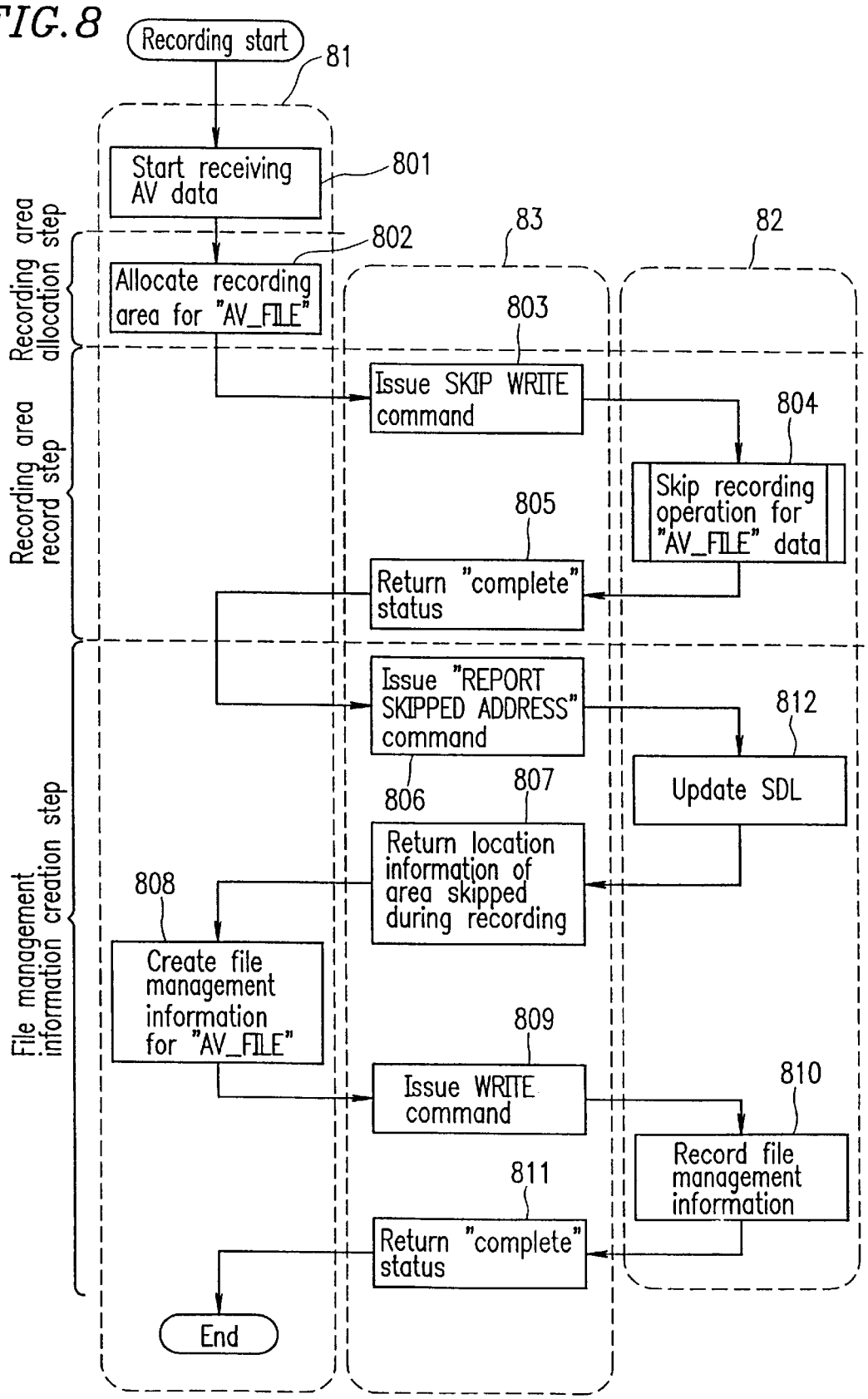
FIG. 8 is a diagram illustrating a procedure of a method for recording a file containing AV data on the disk 1 using the information recording/reproducing system 700.

FIG. 8 illustrates the steps of the recording method.

In FIG. 8, it is assumed that the file management information for a file ("AV_FILE") recorded on the rewritable disk 1 is read out when the disk 1 is inserted into the disk recording/reproducing drive 720, then interpreted by the file management information interpretation section 713, and stored in the upper level control unit 710.

Moreover, in FIG. 8, reference numeral 81 denotes operations performed by the upper level control unit 710, reference numeral 82 denotes those performed by the disk recording/reproducing drive 720, and reference numeral 83 denotes instructions, data and operation results flowing through the I/F protocol between the upper level control unit 710 and the disk recording/reproducing drive 720.

(Step 801) The upper level control unit 710 controls the AV data input section 770 to start an AV data receiving operation. The AV data received by the AV data input section 770 is converted into digital data at the AV data input section 770, and then transmitted through the I/O bus 780 to be stored in the data buffer memory 714.

(Step 802) Prior to an AV data recording operation, the recording area allocation section 711 of the upper level control unit 710 obtains information indicating a free area of the rewritable disk 1 from the file management information interpretation section 713, and allocates the free area as a recording area. The recording area allocation section 711 performs the area allocation operation in view of the size of the area to be allocated and the physical distance from one area to another so that the AV data can be smoothly reproduced.

(Step 803) The skip recording instruction issuing section 716 of the upper level control unit 710 obtains location information of the area allocated by the recording area allocation section 711, and issues a "SKIP WRITE" command (a skip recording instruction) to the disk recording/reproducing drive 720. The skip recording instruction issuing section 716 specifies the location information of the area allocated by the recording area allocation section 711 and the recording size information, as parameters for the "SKIP WRITE" command. Following the "SKIP WRITE" command, data having a size as specified by this command is transferred from the data buffer memory 714 to the disk recording/reproducing drive 720.

Each of FIGS. 23A and 23B illustrates an exemplary format for the "SKIP WRITE" command.

FIG. 23A illustrates an exemplary format for the "SKIP WRITE" command such that it is possible to specify both the allocated area and the size of the data to be recorded through a single issuance of the command. Byte 0 stores a unique instruction code indicating that it is a "SKIP WRITE" command. Bytes 2–5 store an LSN indicating the leading sector of the allocated area. Bytes 6–7 store the number of sectors corresponding to the size of the data to be recorded (data length). Bytes 8–9 store the number of sectors corresponding to the size of the allocated area (area length).

FIG. 23B illustrates an exemplary format for the "SKIP WRITE" command such that the allocated area and the size of the data to be recorded can be specified through a number of issuances of the command. Byte 0 stores a unique instruction code indicating that it is a "SKIP WRITE" command. An operation option is provided at bit 0 of byte 1. The operation option being "1" indicates that the command specifies the allocated area. The operation option being "0" indicates that the command specifies the size of the data to be recorded. When the operation option is "1", bytes 2–5 store an LSN indicating the leading sector of the allocated area, while bytes 7–8 store the number of sectors corresponding to the size of the allocated area (area length). When the operation option is "0", bytes 7–8 store the number of sectors corresponding to the size of the data to be recorded (data length).

The command formats illustrated in FIGS. 23A and 23B are merely examples of the format for the "SKIP WRITE" command. The "SKIP WRITE" command may employ any other format as long as the location information of the allocated area and the size information of the data to be recorded can be specified.

(Step 804) Upon receipt of the "SKIP WRITE" command issued from the upper level control unit 710, the skip recording instruction processing section 722 of the disk recording/reproducing drive 720 initializes the recording control information memory 735 and the recording location storing memory 733 according to the "SKIP WRITE" command, and activates the skip recording controlling section 732. The skip recording controlling section 732 records data from the recording data storing memory 736 into non-defective blocks of the disk 1 while detecting any defective block (including newly-found defective blocks and those which have already been registered in the SDL) using the defective area detection section 731. Each time a defective block is detected, the number of blocks which can be skipped (stored in the recording control information memory 735) is decremented by one, and the location of the defective block is stored in the recording location storing memory 733. Each time a block is successfully recorded, the number of blocks which have been recorded (stored in the recording control information memory 735) is incremented by one. When the recording operation for the number of blocks requested is completed before the number of blocks which can be skipped becomes 0 or less, the process is normally terminated. When it is instructed to verify reproduced data after the recording operation, the defective blocks detected by the defective area detection section 731, as well as those detected by the data verifying section 734, are skipped.

As described above, the skip recording controlling section 732 continues the recording operation until all data is normally recorded while skipping the defective areas detected during the recording operation and storing the skipped location information.

(Step 805) The disk recording/reproducing drive 720, having performed the skip recording operation, returns a "complete" status to the upper level control unit 710.

(Step 806) The recording location request instruction issuing section 717 of the upper level control unit 710 issues to the disk recording/reproducing drive 720 a "REPORT SKIPPED ADDRESS" command for inquiring location information of the defective areas skipped in the skip recording operation in step 804.

FIG. 24A illustrates an exemplary format for the "REPORT SKIPPED ADDRESS" command. Byte 0 stores a unique instruction code indicating that it is a "REPORT SKIPPED ADDRESS" command. Bytes 7–8 store an upper limit value for the size of data to be reported.

FIG. 24B illustrates an exemplary format for data which is reported in response to the "REPORT SKIPPED ADDRESS" command. Bytes 0–1 store the number of location information points to be reported. For byte 4 and thereafter, each set of four bytes stores location information of a skipped defective area.

The command and data formats illustrated in FIGS. 24A and 24B are merely exemplary. The command and the data may employ any other format as long as it is possible to inquire the location information of the skipped defective areas.

(Step 812) The skip location recording section 737 registers, as an SDL entry, the location information of the defective area which was stored in the recording location storing memory 733 during the skip recording operation in step 804. Thus, the defect management information is updated.

(Step 807) Upon receipt of the "REPORT SKIPPED ADDRESS" command, the recording location request instruction processing section 723 of the disk recording/reproducing drive 720 returns, as skipped address data, the location information of the defective area which was stored in the recording location storing memory 733 during the skip recording operation in step 804.

(Step 808) Upon receipt of the skipped address data, the file management information creation section 712 of the upper level control unit 710 creates file management information. The file management information creation section 712 creates the file entry of the AV file while determining that data has been recorded in areas other than the skipped areas as indicated by the skipped address data, and sets the bit of the free space management information corresponding to each area in which data is determined to be recorded to "1" ("used"). The file management information creation section 712 further specifies the skipped areas from the skipped address data returned in step 807, and sets the bit of the free space management information corresponding to each of the skipped areas to "0" ("free"). When the end of the file extent lies in the middle of (but not at the end of) an ECC block, the file management information creation section 712 registers the remaining area of the ECC block as a padding extent. At this time, the extent type of the padding extent is set to "1", indicating that it is a padding extent, and sets the bit of the free space management information corresponding to the padding extent areas to "1" ("used"). Then, the file management information creation section 712 stores the created file management information in the data buffer memory 714 for recording the file management information on the rewritable disk 1.

(Step 809) The upper level control unit 710 issues a "WRITE" command requesting the disk recording/reproducing drive 720 to record, by a conventional recording method, the file management information which is stored in the data buffer memory 714. As parameters for the "WRITE" command, the LSN at which the recording operation is started and the number of sectors to be recorded are specified.

(Step 810) The disk recording/reproducing drive 720 receives the "WRITE" command and records the file management information on the disk 1 according to a conventional recording method. Any defective area which is detected during the recording operation in response to the "WRITE" command is replaced by a conventional replacement method.

(Step 811) The disk recording/reproducing drive 720 having recorded all of the data specified by the "WRITE" command returns a "complete" status to the upper level control unit 710.

Step 812 may be performed immediately after step 804, or when a predetermined period of time has passed after performing step 811 while no request has been issued from the upper level control unit 710.

As described above, the disk recording/reproducing drive 720 detects and skips defective areas while recording AV data which requires real time processing on the disk 1. No replacement area is allocated to the skipped defective areas, but the location of the skipped defective areas is recorded in the defect management information area 4b of the rewritable disk 1.

Next, a method for reproducing a file containing AV data which is recorded on the disk 1 by using the information recording/reproducing system 700 illustrated in FIG. 7 will be described below.

Figure 9:
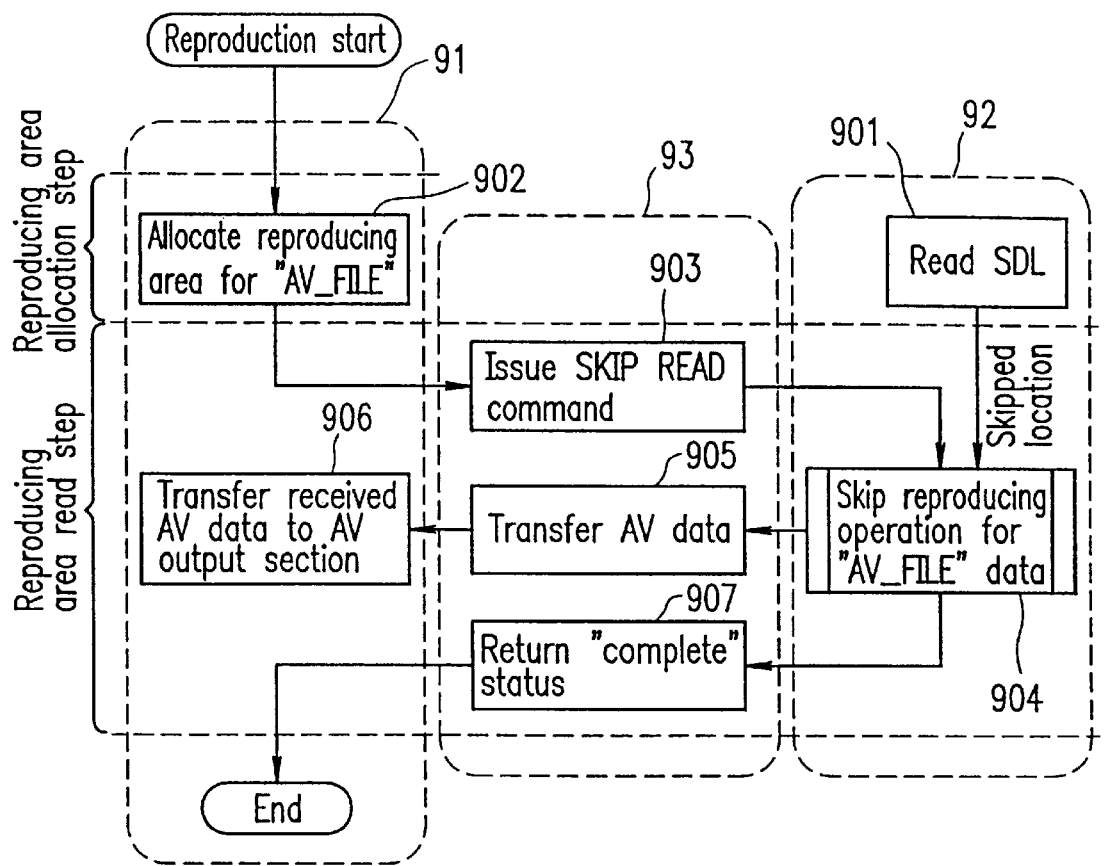
FIG. 9 is a diagram illustrating a procedure of a method for reproducing a file containing AV data recorded on the disk 1 using the information recording/reproducing system 700.

FIG. 9 illustrates the steps of the reproducing method.

In FIG. 9, reference numeral 91 denotes operations performed by the upper level control unit 710, reference numeral 92 denotes those performed by the disk recording/reproducing drive 720, and reference numeral 93 denotes instructions, data and operation results flowing through the I/F protocol between the upper level control unit 710 and the disk recording/reproducing drive 720.

(Step 901) Upon loading of the rewritable disk 1 and when updating the defect management information, the disk recording/reproducing drive 720 reads out the defect management information on the rewritable disk 1 using the skip location reading section 747, and stores it in the reproduction location storing memory 743.

(Step 902) The recording area allocation section 711 of the upper level control unit 710 allocates the AV data recording area (which has previously been allocated in step 802) as a reproducing area.

(Step 903) The skip reproducing instruction issuing section 718 of the upper level control unit 710 obtains the location information of the area allocated in step 902, and issues a "SKIP READ" command (a skip reproducing instruction) to the disk recording/reproducing drive 720. The skip reproducing instruction issuing section 718 specifies the location information of the area allocated in step 902 and the reproducing size information, as parameters for the "SKIP READ" command. Following the "SKIP READ" command, data having a size as specified by this command is transferred from the disk recording/reproducing drive 720 to the data buffer memory 714 (step 905).

The "SKIP READ" command can be defined similarly as the "SKIP WRITE" command. For example, a unique instruction code indicating that it is a "SKIP READ" command may be set in byte 0 in the format illustrated in FIG. 23A or 23B. This is merely an example of the format for the "SKIP READ" command. The "SKIP READ" command may employ any other format as long as the location information of the allocated area and the size information of the data to be reproduced can be specified.

(Step 904) Upon receipt of the "SKIP READ" command issued from the upper level control unit 710, the skip reproducing instruction processing section 724 of the disk recording/reproducing drive 720 initializes the reproduction control information memory 745 according to the "SKIP READ" command, and activates the skip reproduction controlling section 742. The skip reproduction controlling section 742 reproduces data from non-defective blocks of the disk 1 with reference to the reproduction location storing memory 743, and stores the reproduced data in the read-out data storing memory 746. Each time a block is successfully reproduced, the number of blocks which have been reproduced (stored in the reproduction control information memory 745) is incremented by one. When the reproducing operation for the number of blocks requested is completed, the process is normally terminated.

(Step 905) The AV data stored in the read-out data storing memory 746 in step 904 is transferred to the upper level control unit 710.

(Step 906) The received AV data is transferred to the AV data output section 760. The AV data output section 760 converts input data to an analog AV signal and outputs the analog AV signal.

(Step 907) The disk recording/reproducing drive 720 having performed the skip reproducing operation returns a "complete" status to the upper level control unit 710.

As described above, the disk recording/reproducing drive 720 references the defect management information when reproducing AV data which requires real time processing, whereby the disk recording/reproducing drive 720 can reproduce the AV data while skipping defective areas on the rewritable disk 1.

(Embodiment 3)

Another embodiment of an information recording/reproducing system for recording information on, or reproducing recorded information from, the disk 1 as described in Embodiment 1 above will now be described with reference to the figures.

Figure 10:
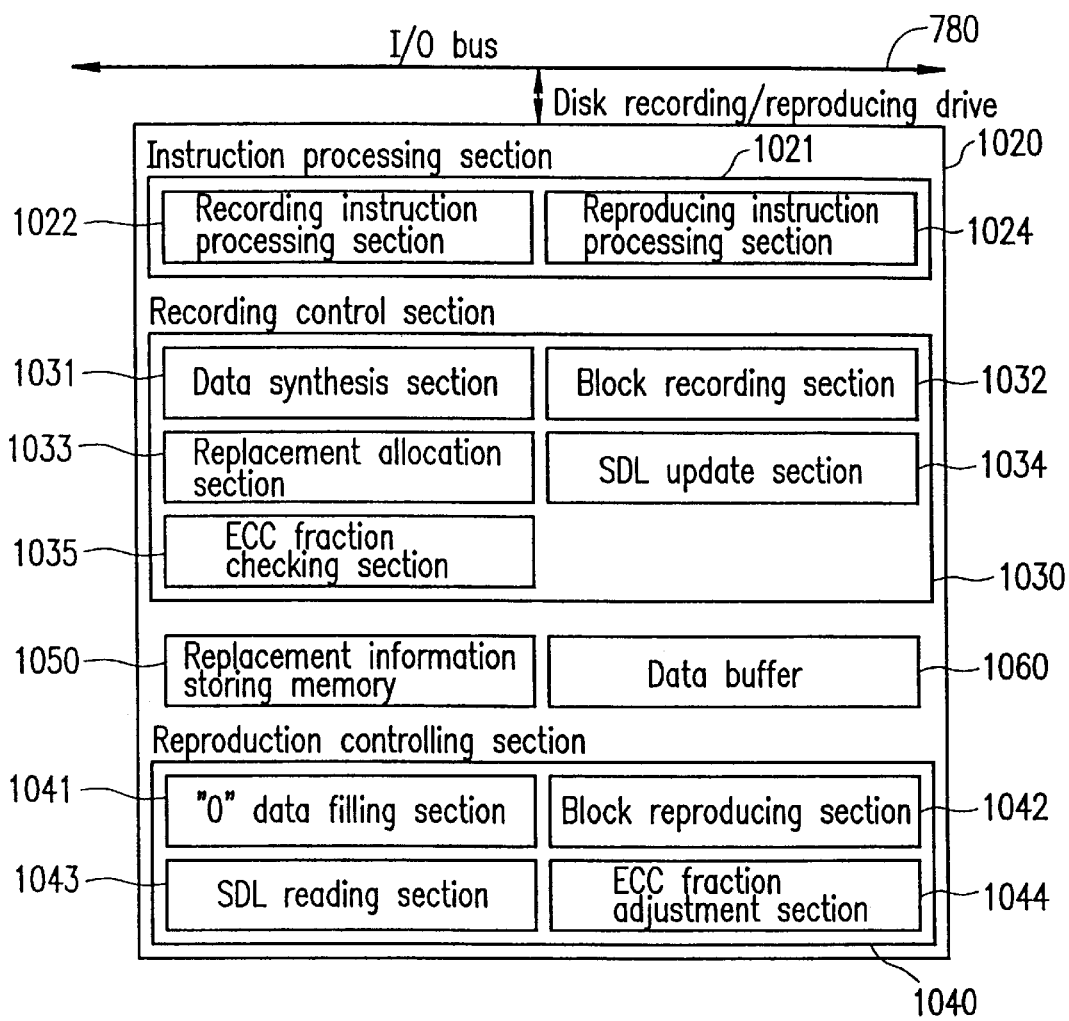
FIG. 10 is a block diagram illustrating a structure of a disk recording/reproducing drive 1020 according to Embodiment 3 of the present invention.

FIG. 10 is a block diagram illustrating a structure of a disk recording/reproducing drive 1020 according to Embodiment 3 of the present invention. The disk recording/reproducing drive 1020 is connected to the upper level control unit 710 illustrated in FIG. 7 via the I/O bus 780.

The disk recording/reproducing drive 1020 includes a microprocessor in which a control program and an arithmetic memory are provided. The disk recording/reproducing drive 1020 is made of a mechanical section, a signal processing circuit, etc., which are controlled by the microprocessor. The disk recording/reproducing drive 1020 operatively includes: an instruction processing section 1021 for processing an instruction from the upper level control unit 710; a recording control section 1030 for controlling the recording operation on the rewritable disk 1; a reproduction controlling section 1040 for controlling the reproducing operation from the rewritable disk 1; a replacement information storing memory 1050 for storing information of defective blocks and information of replacement blocks allocated thereto; and a data buffer 1060 for temporarily storing recording data and reproduced data.

The instruction processing section 1021 includes: a recording instruction processing section 1022 for processing a normal recording instruction which does not involve a skip recording operation; and a reproducing instruction processing section 1024 for processing a normal reproducing instruction which does not involve a skip reproducing operation.

The recording control section 1030 includes: a data synthesis section 1031 for converting sector-wise recording data (recording data which is arranged in the unit of sectors) into ECC block-wise recording data (recording data which is arranged in the unit of ECC blocks); a block recording section 1032 for recording the ECC block-wise data on the rewritable disk 1; a replacement allocation section 1033 for allocating a spare block for replacing a defective block; an SDL update section 1034 for recording the contents of the replacement information storing memory 1050 in the SDL on the rewritable disk 1: and an ECC fraction checking section 1035.

The reproduction controlling section 1040 includes: a "0" data filling section 1041 for rewriting a portion of the data buffer 1060 with "0"s, a block reproducing section 1042 for reproducing ECC block-wise data from the rewritable disk 1; an SDL reading section 1043 for storing the contents reproduced from the SDL on the rewritable disk 1 in the replacement information storing memory 1050; and an ECC fraction adjustment section 1044.

Next, a method for reproducing normal computer data (not real time data) recorded on the disk 1 by using the disk recording/reproducing drive 1020 illustrated in FIG. 10 will be described below.

Figure 11:
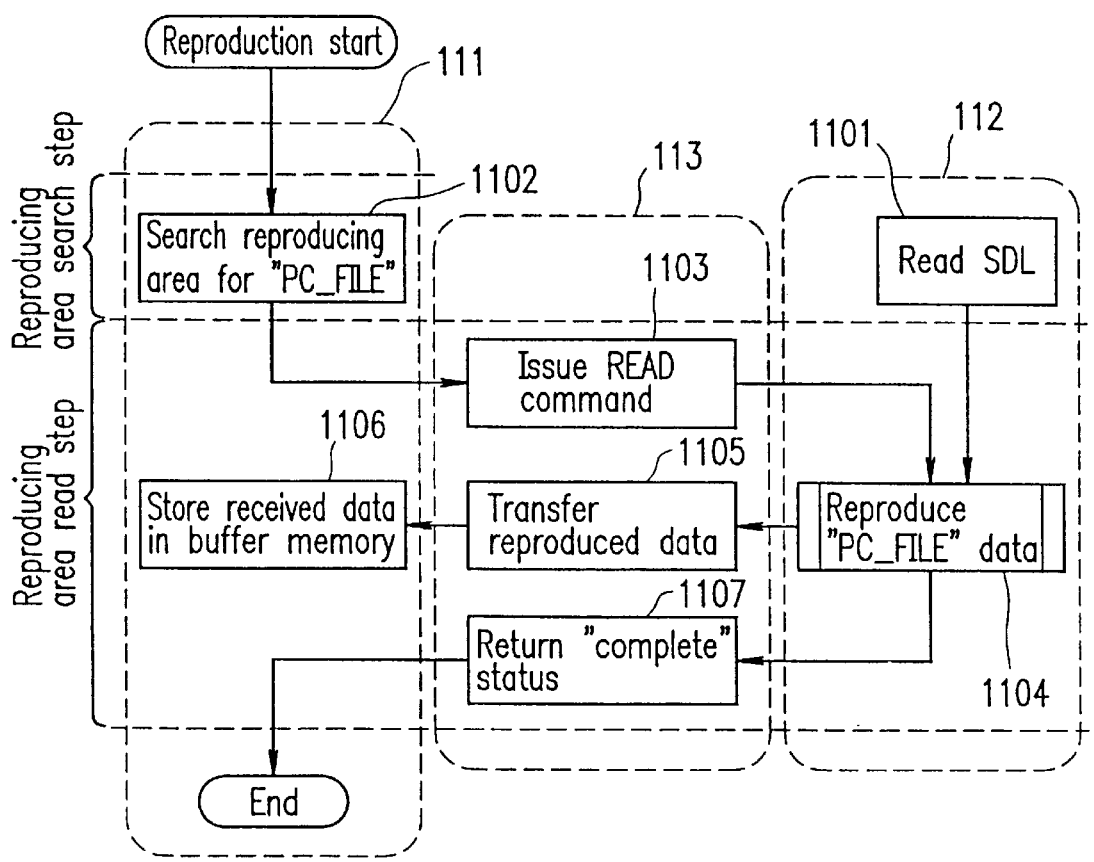
FIG. 11 is a procedure of a method for reproducing normal computer data (not real time data) recorded on the disk 1 using the disk recording/reproducing drive 1020.

FIG. 11 illustrates the steps of the reproducing method.

In FIG. 11, reference numeral 111 denotes operations performed by the upper level control unit 710, reference numeral 112 denotes those performed by the disk recording/reproducing drive 1020, and reference numeral 113 denotes instructions, data and operation results flowing through the I/F protocol between the upper level control unit 710 and the disk recording/reproducing drive 720. The reproducing operation performed by the disk recording/reproducing drive 1020 will be described only briefly below, and detailed description thereof will be provided later.

(Step 1101) Upon loading of the rewritable disk 1 and when updating the defect management information, the disk recording/reproducing drive 1020 reads out the defect management information on the rewritable disk 1 using the SDL reading section 1043, and stores it in the replacement information storing memory 1050.

(Step 1102) The upper level control unit 710 analyzes the file structure so as to determine the location of an area where computer data is stored.

(Step 1103) The upper level control unit 710 obtains information indicating the location of the area which has been determined in step 1102, and issues a "READ" command (a normal reproducing instruction) to the disk recording/reproducing drive 1020.

(Step 1104) Upon receipt of the "READ" command, the reproducing instruction processing section 1024 of the disk recording/reproducing drive 1020 reads out the specified data from the rewritable disk 1, and transfers the data to the upper level control unit 710 (step 1105). The disk recording/reproducing drive 1020 having transferred all of the data requested returns a "complete" status (step 1107).

(Step 1106) The reproduced data is transferred via the I/F protocol and stored in the data buffer memory 714 of the upper level control unit 710.

As the upper level control unit 710 receives the "complete" status via the I/F protocol, the data stored in the data buffer memory 714 is used as computer data.

Figure 12:
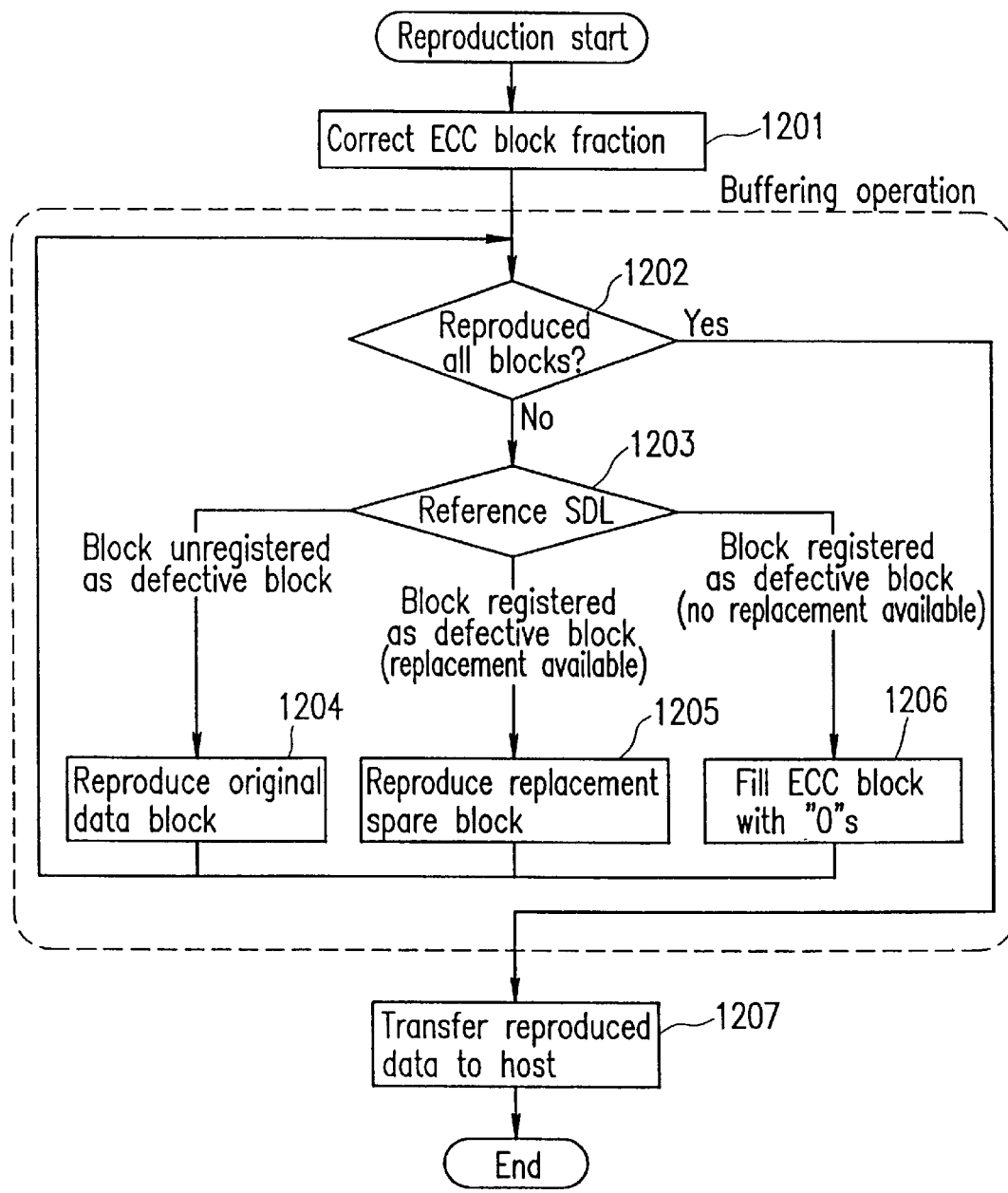
FIG. 12 is a flow chart illustrating a procedure of a reproducing operation performed by the disk recording/reproducing drive 1020.

FIG. 12 is a flow chart illustrating a procedure of the reproducing operation (step 1104 in FIG. 11) performed by the disk recording/reproducing drive 1020.

The area requested to be reproduced is specified by sectors. The ECC fraction adjustment section 1044 determines the ECC blocks that include the area requested to be reproduced (step 1201). Assuming that S is the LSN of the leading sector of the area requested to be reproduced, N is the number of sectors of the area requested to be reproduced, and E is the number of sectors of one ECC block, then, the LSN (S_ECC) of the leading sector of the area which needs to be reproduced and the number of sectors (N_ECC) of the area which needs to be reproduced in view of the ECC block can be determined by the following expressions.

$$S\_ECC=[S/E] \times E$$

$$N\_ECC=[(S+N+E-1)/E] \times E-S\_ECC$$

where [α] denotes the largest integer not exceeding α.

If all of the blocks which need to be reproduced have not completely been stored in the data buffer 1060 (step 1202), the SLD is referenced (step 1203). If the block to be reproduced is not registered in the SDL as a defective block, the process proceeds to step 1204. If the block to be reproduced is registered in the SDL as a defective block to which a replacement spare block has been allocated, the process proceeds to step 1205. If the block to be reproduced is registered in the SDL as a defective block to which a replacement spare block has not been allocated, the process proceeds to step 1206.

In step 1204, the block to be reproduced is reproduced. In step 1205, the replacement spare block is reproduced instead of the block to be reproduced. In step 1206, "0" data filling section 1041 create the ECC block filled with "0" instead of reproducing the data from disk 1. The ECC block filled with "0"s is created by, for example, filling a predetermined area of the data buffer 1060 with "0"s.

If all of the blocks which need to be reproduced have completely been stored in the data buffer 1060 (step 1202), the data stored in the data buffer 1060 is transferred to the upper level control unit 710 (step 1207), and the process is terminated.

Where the block to be reproduced is registered in the SDL as a defective block to which a replacement spare block has not been allocated, it is alternatively possible to immediately determine a reproduction error while reporting the error to the upper level control unit 710, rather than creating an ECC block filled with "0"s as the reproduced data for the defective block. When a reproduction error is reported to the upper level control unit 710, the upper level control unit 710 instructs a data recording operation for the block, thus performing a replacement operation which will be described later. As a result, the defective block to replaced by a reproducible spare block in the logical volume space.

As described above, when it is requested to reproduce data from a defective block to which a replacement spare block has not been allocated, the disk recording/reproducing drive 1020 returns data filled with "0"s as reproduced data, without reporting a reproduction error. Alternatively, when it is requested to reproduce data from a defective block to which a replacement spare block has not been allocated, the disk recording/reproducing drive 1020 may report a reproduction error without wasting time for a reproducing operation which is likely to fail.

The steps of the method for recording normal computer data (not real time data) on the disk 1 are substantially the same as those of the reproducing method as illustrated in FIG. 11, except that a "WRITE" command is issued instead of a "READ" command, and recording data is transmitted in the reverse direction instead of reproduced data.

Figure 13:
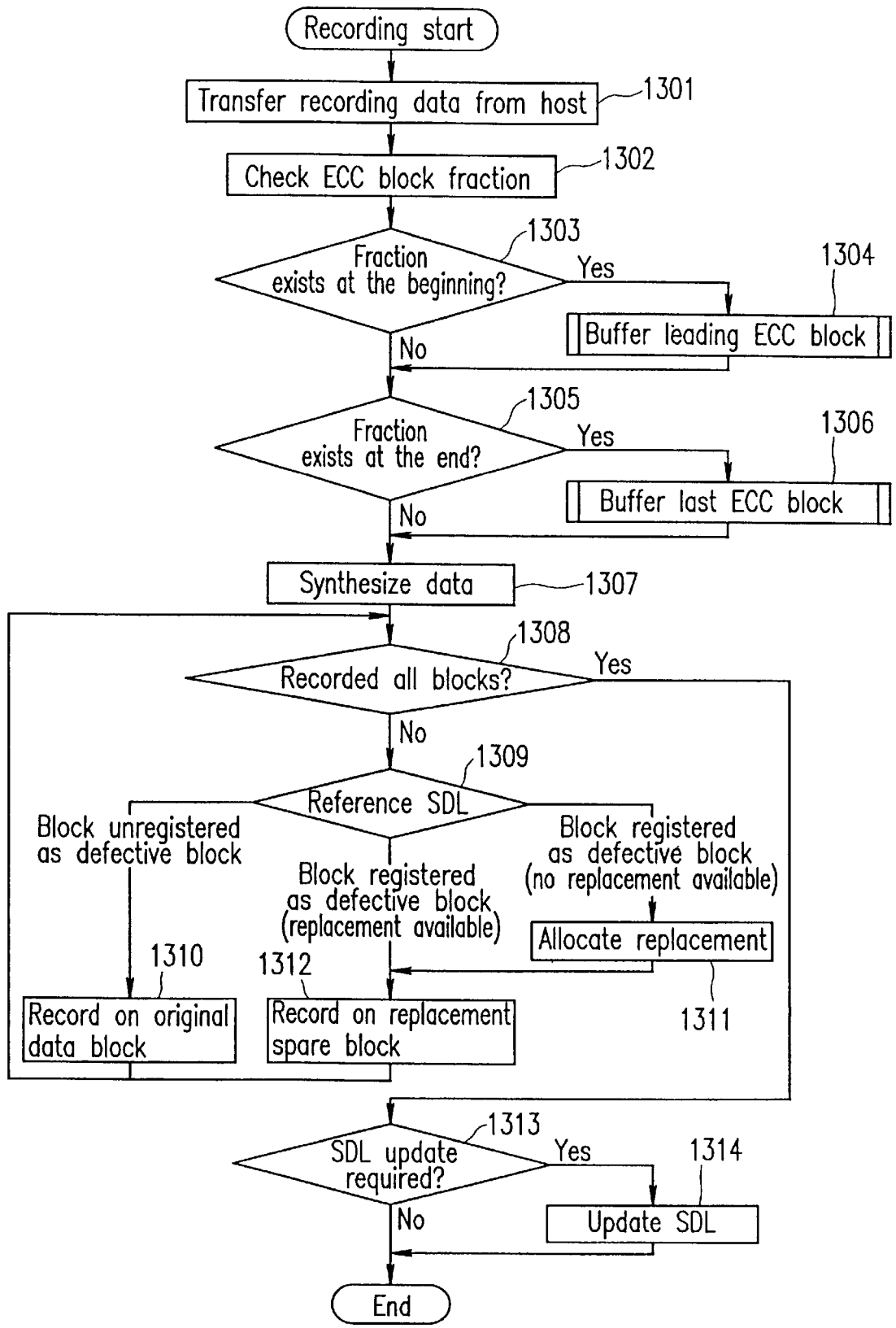
FIG. 13 is a flow chart illustrating a procedure of a recording operation performed by the disk recording/reproducing drive 1020.

FIG. 13 is a flow chart illustrating a procedure of the recording operation performed by the disk recording/reproducing drive 1020.

The disk recording/reproducing drive 1020 receives data to be recorded from the upper level control unit 710, and stores it in the data buffer 1060 (step 1301).

The area requested to be recorded is specified by sectors. ECC fraction checking section 1035 determines the ECC blocks that include the area requested to be reproduced.

Furthermore, the ECC fraction checking section 1035 determines to perform a buffering operation for the fraction according to existence of the fraction. Such a buffering operation is accomplished by steps 1202–1206 which are surrounded by a broken line in FIG. 12.

If the leading sector of the area requested to be recorded is not the leading sector of an ECC block (i.e., if S≠S_ECC) (step 1303), a buffering operation is performed for the ECC block including the leading sector (step 1304).

If the last sector of the area requested to be recorded is not the last sector of an ECC block (i.e., if S+N≠S_ECC+N_ECC) (step 1305), a buffering operation is performed for the ECC block including the last sector (step 1306).

The data synthesis section 1031 synthesizes the data obtained in step 1301 with the data obtained in steps 1303–1306. As a result, recording data corresponding to all of the ECC blocks to be recorded is provided in the data buffer 1060 (step 1307).

If all of the blocks which need to be recorded have not completely been recorded on the rewritable disk 1 (step 1308), the SDL is referenced (step 1309). As a result, if the block to be recorded is not registered in the SDL as a defective block, the process proceeds to step 1310. If the block to be recorded is registered in the SDL as a defective block to which a replacement spare block has been allocated, the process proceeds to step 1312. If the block to be recorded is registered in the SDL as a defective block to which a replacement spare block has not been allocated, the process proceeds to step 1311.

In step 1310, data is recorded in a block to be recorded. In step 1312, data is recorded in a replacement spare block instead of the block to be recorded. In step 1311, the replacement allocation section 1022 allocates a replacement spare block to the defective block, then the data is recorded in the replacement spare block (step 1312).

There are two methods for allocating a replacement spare block for a defective block instep 1311. As described above with reference to FIGS. 1C to 1E, it is possible to determine whether a replacement block was previously allocated to a defective block based on the value of the field 22c storing the location of the replacement block. If no replacement block was previously allocated to the defective block (e.g., if the value of the field 22c is "0"), a free spare block is newly allocated to the defective block. If a replacement block was previously allocated to the defective block (e.g., if an address of a previously allocated replacement block is described in the field 22c), the same replacement block as that which was previously allocated to the defective block is allocated again to the defective block.

If all of the blocks which need to be recorded have not completely been recorded on the rewritable disk 1 (step 1308), it is determined whether the SDL needs to be updated (step 1313). For example, where a replacement spare block has been newly allocated to the defective block in step 1311, the SDL needs to be updated. If the SDL needs to be updated, the SDL is updated (step 1314), and the process is terminated.

As described above, when the disk recording/reproducing drive 1020 is requested to record data in a defective block to which a replacement spare block has not been allocated, a replacement spare block is first allocated to the defective block, after which the data is recorded in the replacement spare block. In this way, the recording data is recorded on the disk 1 by ECC blocks. Any ECC block fraction is adjusted by, for example, filling the fraction with "0"s.

(Embodiment 4)

Still another embodiment of an information recording/reproducing system for recording information on, or reproducing recorded information from, the disk 1 as described in Embodiment 1 above will now be described with reference to the figures.

Figure 14:
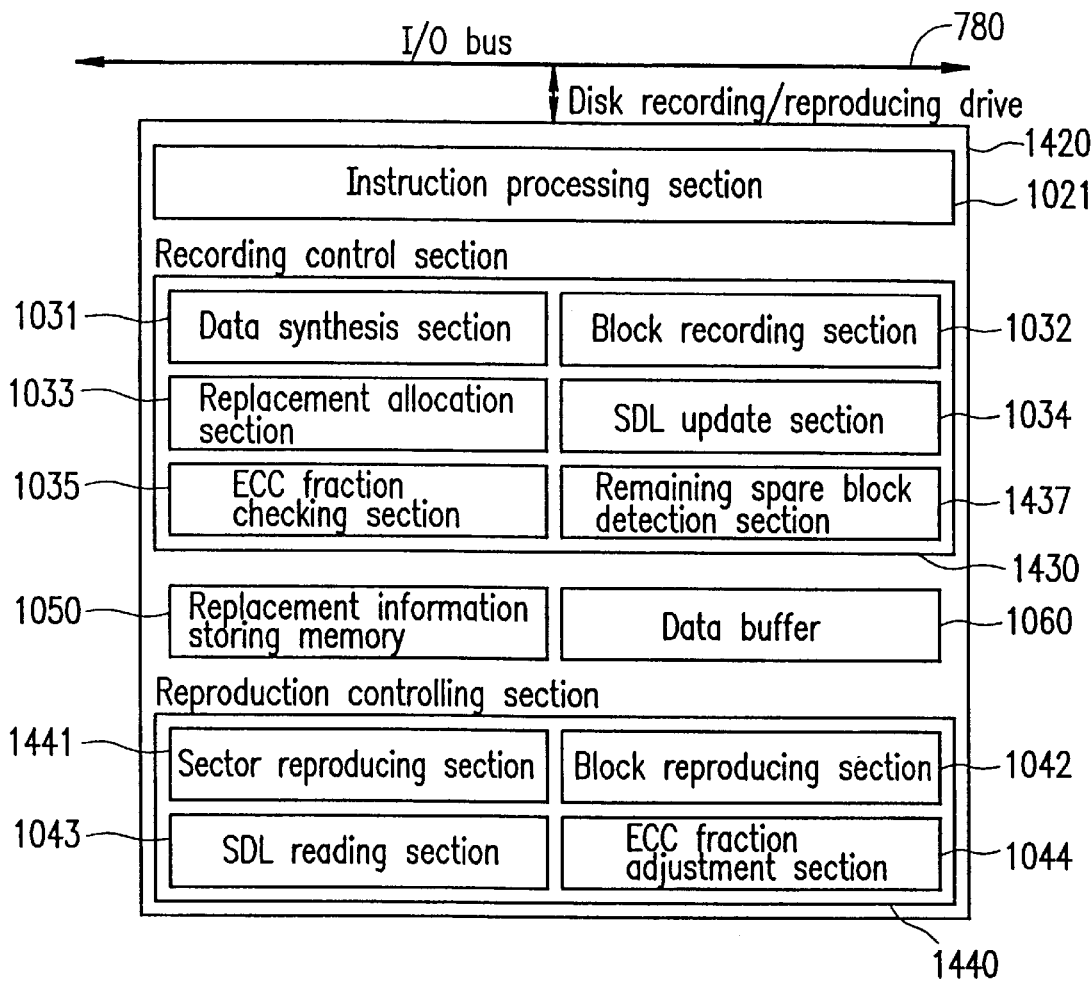
FIG. 14 is a block diagram illustrating a structure of a disk recording/reproducing drive 1420 according to Embodiment 4 of the present invention.

FIG. 14 is a block diagram illustrating a structure of a disk recording/reproducing drive 1420 according to Embodiment 4 of the present invention. The disk recording/reproducing drive 1420 is connected to the upper level control unit 710 illustrated in FIG. 7 via the I/O bus 780. Elements in FIG. 14 having like reference numerals to those shown in FIG. 10 will not further be described.

The disk recording/reproducing drive 1420 operatively includes: an instruction processing section 1021 for processing an instruction from the upper level control unit 710; a recording control section 1430 for controlling the recording operation on the rewritable disk 1; a reproduction controlling section 1440 for controlling the reproducing operation from the rewritable disk 1; a replacement information storing memory 1050 for storing information of defective blocks and information of replacement blocks allocated thereto; and a data buffer 1060 for temporarily storing recording data and reproduced data.

As compared to the recording control section 1030 described in Embodiment 3 above, the recording control section 1430 additionally includes a remaining spare block detection section 1437 for determining the number of spare blocks remaining available.

As compared to the reproduction controlling section 1040 described in Embodiment 3 above, the reproduction controlling section 1440 does not include the "0" data filling section 1041, but rather includes a sector reproducing section 1441 for reproducing data recorded on the rewritable disk 1 by sectors.

The steps of the method for reproducing normal computer data (not real time data) are the same as those described in Embodiment 3 above (FIG. 11), and therefore will not further be described below.

Figure 15:
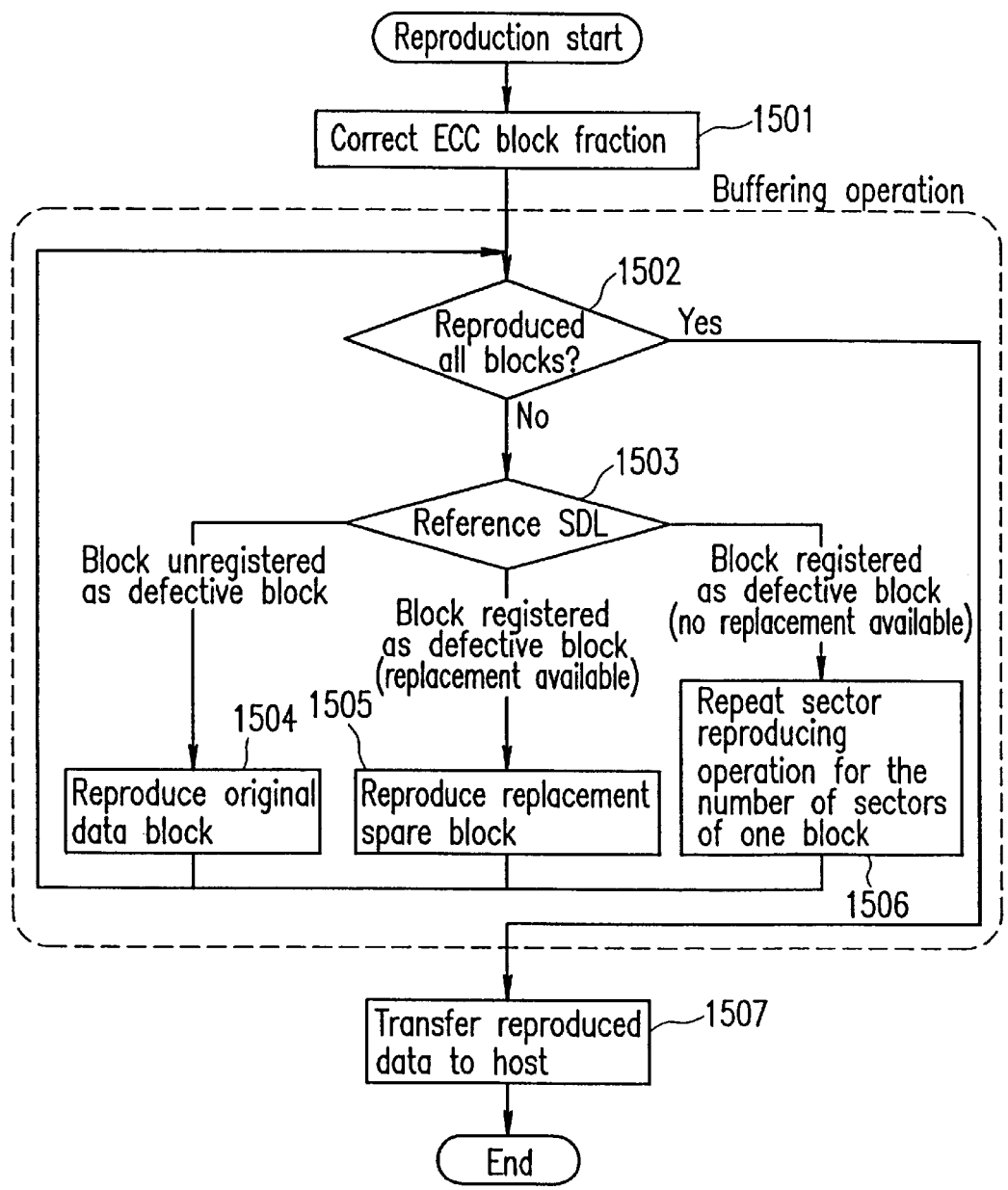
FIG. 15 is a flow chart illustrating a procedure of a reproducing operation performed by the disk recording/reproducing drive 1420.

FIG. 15 is a flow chart illustrating a procedure of the reproducing operation performed by the disk recording/reproducing drive 1420. The procedure illustrated in FIG. 15 is different from that illustrated in FIG. 12 for the following reason. If an ECC block to be reproduced is registered in the SDL as a defective block to which a replacement spare block has not been allocated (step 1503), the sector reproducing section 1441 performs a sector-wise reproducing operation for each of sectors included in the ECC block to be reproduced (step 1507).

Figure 22A:
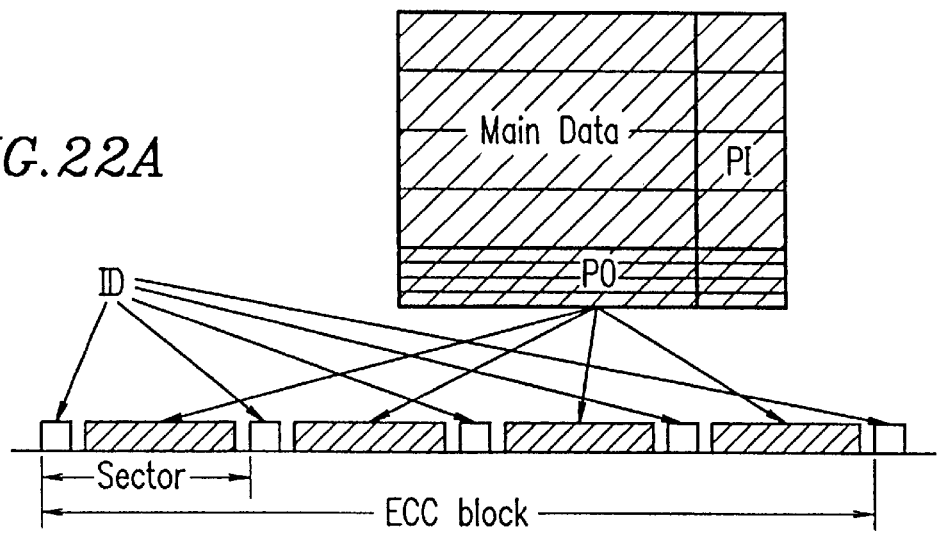
FIG. 22A is a diagram illustrating a normally recorded ECC block.
Figure 22B:
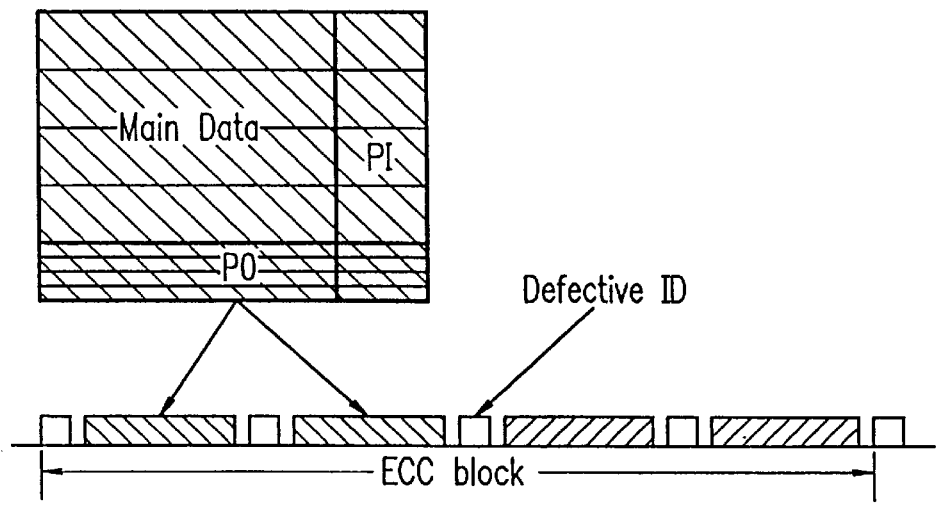
FIG. 22B is a diagram illustrating an ECC block for which an overwrite operation failed.
Figure 22C:
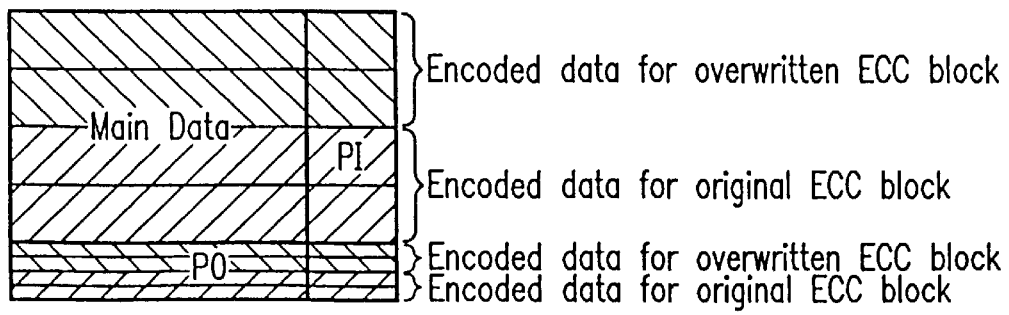
FIG. 22C is a diagram illustrating a structure of reproduced data from an ECC block for which an overwrite operation failed.

Referring to FIG. 22C, the sector-wise reproducing operation will be described below. Since the inner code parity PI is obtained by calculating error correcting codes for each row (in the lateral direction), the inner code parities PI correctly correspond to the main data for each sector (i.e., in FIG. 22c, the hatching direction for the main data area matches that for the inner code parities PI). Therefore, errors can be corrected with the inner code parities PI, though the error correction capability is reduced. For example, when a data recording operation stops at a boundary between sectors due to a defective ID, the error may be corrected with a high probability even with the inner code parities PI alone.

As described above, the disk recording/reproducing drive 1420 can reproduce a defective block to which a replacement spare block has not been allocated by recovering correct data from the overwritten sectors in the defective block while recovering data previously recorded in the other sectors in the defective block which have not been overwritten.

Figure 16:
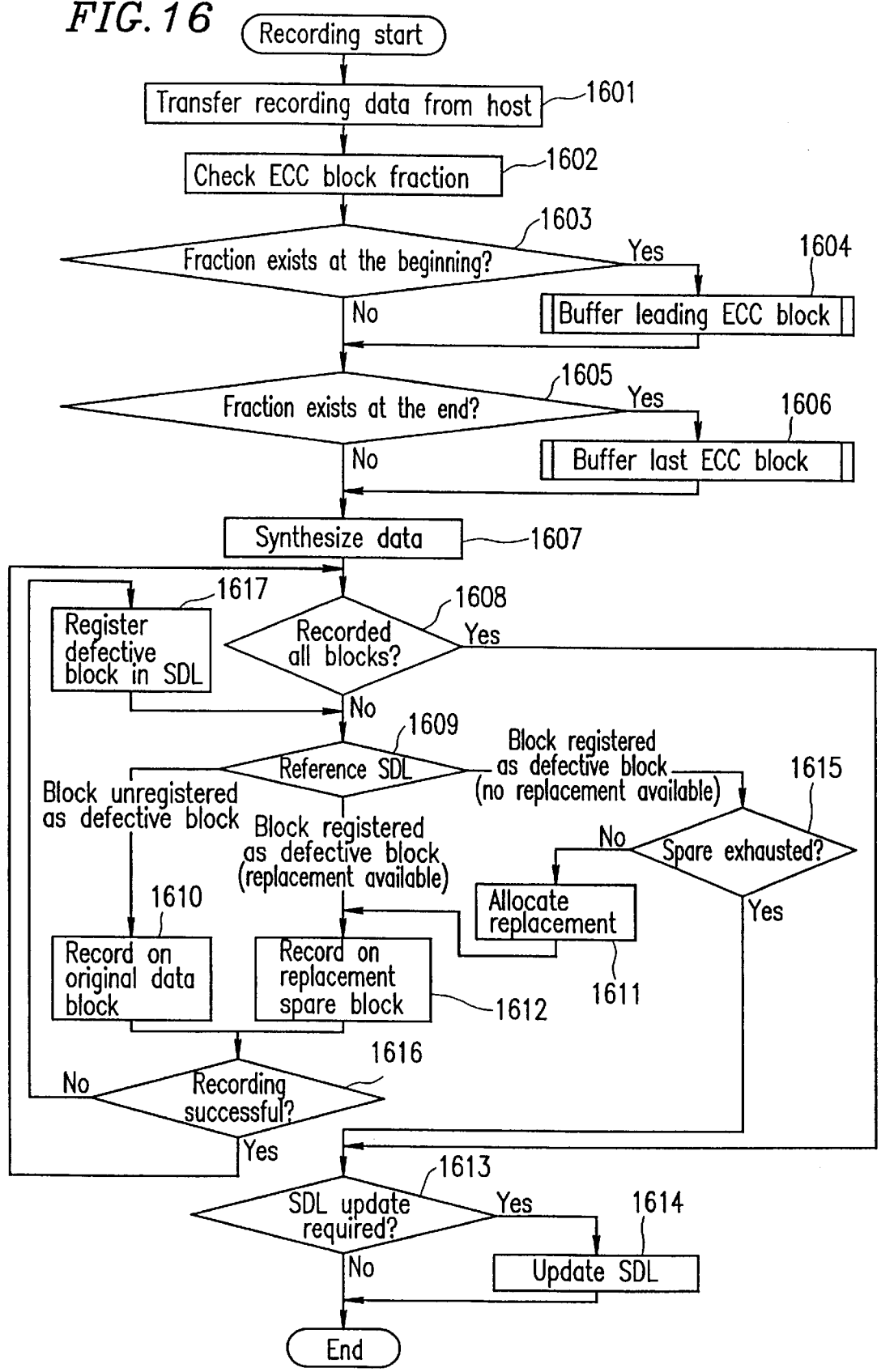
FIG. 16 is a flow chart illustrating a procedure of a recording operation performed by the disk recording/reproducing drive 1420.

FIG. 16 is a flow chart illustrating a procedure of the recording operation performed by the disk recording/reproducing drive 1420. The procedure illustrated in FIG. 16 is different from that illustrated in FIG. 13 for the following reason. If a block-wise data recording operation on the rewritable disk 1 fails, the block for which the recording operation failed is registered in the SDL as a defective block. Moreover, before allocating a replacement spare block to a defective block, the process is terminated with an error if there is no spare block available.

The disk recording/reproducing drive 1420 receives data to be recorded from the upper level control unit 710, and stores it in the data buffer 1060 (step 1601).

The area requested to be recorded is specified by sectors. An area including the area requested to be recorded is determined by ECC blocks (step 1602).

If there is any ECC block fraction, a buffering operation for the fraction is performed. Such a buffering operation is accomplished by steps 1502–1506 which are surrounded by a broken line in FIG. 15.

By synthesizing the data obtained in step 1601 with the data obtained in steps 1603–1606, recording data corresponding to all of the ECC blocks required for the recording operation is provided in the data buffer 1060 (step 1607).

If all of the blocks which need to be recorded have not completely been recorded on the rewritable disk 1 (step 1608), the SDL is referenced (step 1609). As a result, if the block to be recorded is not registered in the SDL as a defective block, the process proceeds to step 1610. If the block to be recorded is registered in the SDL as a defective block to which a replacement spare block has been allocated, the process proceeds to step 1612. If the block to be recorded is registered in the SDL as a defective block to which a replacement spare block has not been allocated, the process proceeds to step 1615.

In step 1610, data is recorded in a block to be recorded. In step 1612, data is recorded in a replacement spare block instead of the block to be recorded. In step 1615, the remaining spare block detection section 1437 determines whether there are any available spare blocks in the spare area. If there is an available spare block in the spare area, the replacement spare block is allocated to the block to be recorded (step 1611), and data is recorded in the replacement spare block (step 1612).

In step 1610 or step 1612, if block-wise data recording operation on the rewritable disk 1 fails (step 1616), the block for which the recording operation failed is registered in the SDL as a defective block (step 1617), and the process returns to step 1609 to retry the recording operation.

If all of the blocks which need to be recorded have completely been stored on the rewritable disk 1 (step 1608), or if there is no available spare block in the spare area (step 1615), it is determined whether the SDL needs to be updated (step 1613). For example, where a replacement spare block has been newly allocated to the defective block in step 1611, the SDL needs to be updated. Also where a defective block which has been detected in step 1617 is newly registered in the SDL, the SDL needs to be updated. If the SDL needs to be updated, the SDL is updated (step 1614), and the process is terminated.

Where the process is terminated after all of the blocks have completely been recorded (step 1608), the termination is determined to be normal. Where the process is terminated after spare area exhaustion (step 1615), the termination is determined to be a termination with an error.

As described above, the disk recording/reproducing drive 1420 always registers a detected defective block in the defect management information area even if no spare block is available for replacement. Moreover, when the disk recording/reproducing drive 1420 is requested to record data in a defective block to which a replacement spare block has not been allocated, the drive can synthesize the record date received from the upper level control unit with the correct data from the overwritten sector and the previous data from the other sectors in the defective block in which the terminating occurred during recording. Such synthesized recording data is recorded on the disk 1 by ECC blocks.

While the parameters transferred by the I/F protocol include the area start location, the size, etc., in Embodiments 2, 3 and 4, it is apparent to those skilled in the art that the parameters may be any other parameters as long as they can be subjected to an arithmetic operation to obtain the same information. Moreover, the data transmission between the upper level control unit and the disk recording/reproducing drive, and that between the disk recording/reproducing drive and the rewritable disk, may be sequential or parallel. Furthermore, it is also apparent to those skilled in the art that when the upper level control unit and the disk recording/reproducing drive are integrated together, the parameters may be transferred by using a shared memory, or the like.

According to the information recording medium of the present invention, defect management information including status information which indicates whether a defective area is replaced by a replacement area is recorded in the defect management information area. With this status information, it is possible to manage the status where a defective area has been detected but is not replaced by a replacement area.

When a defective area is detected while recording data which requires real time processing (e.g., AV data) on the information recording medium, the defective area is skipped. The location of the defective area and status information indicating that the defective area is not replaced by a replacement area are written in the defect management information area. When it is requested to record data which does not require real time processing (e.g., non-AV data) in the defective area, a replacement area is allocated to the defective area without performing a read modified write operation, thereby successfully performing the requested recording operation. Moreover, a replacement area is not allocated to the defective area until it is actually requested to record data in the defective area. This provides an advantage in that no replacement area is wasted.

Where a spare area is expandable, the spare area may temporarily run out of available replacement areas. When no replacement area can be allocated to a detected defective area because the spare area is temporarily out of available replacement areas, the location of the defective area and status information indicating that the defective area is not replaced by a replacement area are written in the defect management information area. After the spare area is expanded and a replacement area is made available, the replacement area is allocated to the defective area. The location of the replacement area is written in the defect management information area.

According to the information recording method and the information recording apparatus of the present invention, defect management information, including status information which indicates whether a defective area is replaced by a replacement area, is recorded in the defect management information area. Thus, effects similar to those described above are obtained.

According to the information reproducing apparatus of the present invention, it is determined whether a defective area is replaced by a replacement area with reference to the status information, so as to control the reproducing operation of user data according to the determination. Thus, user data can be reproduced even if a defective area is not replaced by a replacement area.

When it is requested to reproduce data from a defective area to which a replacement area has not been allocated, user data may be reproduced while skipping the defective area. Alternatively, data having a fixed value (e.g., data filled with "0"s) may be output as reproduced data obtained by reproducing the defective area. Alternatively, corrected data may be reproduced by not performing error correction with error correcting codes which expand over a plurality of sectors, while only performing error correction with error correcting codes which do not expand over a plurality of sectors (e.g., error correcting codes within each sector).

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An information recording medium, comprising:

a volume space for recording user data;

an expandable spare area including a replacement area which is usable in place of a defective area included in the volume space; and a defect management information area for recording defect management information for managing the defective area, wherein:

the defect management information includes status information indicating whether the defective area is replaced by the replacement area, when there are no available replacement area included in the spare area temporarily, the status information indicating that the defective area is not replaced by the replacement area is written into the defect management information area.

2. A method for recording information on an information recording medium including a volume space for recording user data; and expandable spare area including a replacement area which is usable in place of a defective area included in the volume space; and a defect management information area for recording defect management information for managing the defective area, the method comprising the steps of:

detecting the defective area;

recording status information indicating whether the defective area is replaced by the replacement area in the defect management information; and detecting that there are no available replacement area included in the spare area temporarily, wherein:

when there are no available replacement area included in the spare area temporarily, the status information indicating that the defective area is not replaced by the replacement area is written into the defect management information area.

3. An apparatus for recording information on an information recording medium including a volume space for recording user data; an expandable spare area including a replacement area which is usable in place of a defective area included in the volume space; and a defect management information area for recording defect management information for managing the defective area, the apparatus comprising:

a first detection section for detecting the defective area;

a recording section for recording status information indicating whether the defective area is replaced by the replacement area in the defect management information; and a second detection section for detecting that there are no available replacement area included in the spare area temporarily, wherein:

when there are no available replacement area included in the spare area temporarily, the recording section writes the status information indicating that the defective area is not replaced by the replacement area into the defect management information area.

* * * * *